(12) United States Patent
Wu et al.

(10) Patent No.: US 12,254,920 B2
(45) Date of Patent: Mar. 18, 2025

(54) STATIC RANDOM ACCESS MEMORY CIRCUIT AND READ/WRITE OPERATION METHOD THEREOF

(71) Applicant: UPBEAT TECHNOLOGY Co., Ltd, New Taipei (TW)

(72) Inventors: Bing-Chen Wu, New Taipei (TW); Shuo-Hong Hung, New Taipei (TW); Chung-Chieh Chen, New Taipei (TW)

(73) Assignee: UPBEAT TECHNOLOGY Co., Ltd, New Taipei (TW)

( * ) Notice: Subject to any disclaimer, the term of this patent is extended or adjusted under 35 U.S.C. 154(b) by 185 days.

(21) Appl. No.: 18/093,771

(22) Filed: Jan. 5, 2023

(65) Prior Publication Data
US 2023/0215492 A1 Jul. 6, 2023

Related U.S. Application Data
(60) Provisional application No. 63/296,883, filed on Jan. 6, 2022.

(30) Foreign Application Priority Data
Dec. 14, 2022 (TW) .................................. 111148020

(51) Int. Cl.
| G11C 11/408 | (2006.01) |
| G11C 11/4074 | (2006.01) |
| G11C 11/4091 | (2006.01) |
| G11C 11/4094 | (2006.01) |

(52) U.S. Cl.
CPC ...... *G11C 11/4091* (2013.01); *G11C 11/4074* (2013.01); *G11C 11/4085* (2013.01); *G11C 11/4094* (2013.01)

(58) Field of Classification Search
CPC ............ G11C 11/4091; G11C 11/4074; G11C 11/4085; G11C 11/4094; G11C 5/147; G11C 11/419
USPC .................................................... 365/185.21
See application file for complete search history.

(56) References Cited

U.S. PATENT DOCUMENTS
2017/0316820 A1* 11/2017 Kumar ................... G11C 5/147
* cited by examiner

*Primary Examiner* — Huan Hoang
(74) *Attorney, Agent, or Firm* — Innovation Counsel LLP

(57) ABSTRACT

A static random-access memory (SRAM) circuit and associated read operation method and write operation method are provided. The SRAM circuit includes memory units arranged in M columns and N rows, M bit lines, N row-voltage selection lines, N word lines, and a control circuit. The control circuit includes a controller, a voltage source, a voltage selection module, a word-line driving module, and a bit-line driving module. The voltage source provides a first voltage and a second voltage. When the control circuit performs access to the memory unit located in the mth column and the nth row, the voltage selection module transmits one of the first voltage and the second voltage to an nth row-voltage selection line. The voltage selection module transmits the second voltage to the other (N−1) row-voltage selection lines. The variables M, N, m, and n are positive integers.

17 Claims, 10 Drawing Sheets

FIG. 1 (PRIOR ARTS)

FIG. 2 (PRIOR ARTS)

STATIC RANDOM ACCESS MEMORY CIRCUIT AND READ/WRITE OPERATION METHOD THEREOF

This application claims the benefit of U.S. provisional application Ser. No. 63/296,883, filed Jan. 6, 2022 and Taiwan application Serial No. 111148020, filed Dec. 14, 2022, the disclosure of which are incorporated by references herein in its entirety.

TECHNICAL FIELD

The disclosure relates in general to a static random access memory circuit and associated read/write operation method, and more particularly to a static random access memory circuit and associated read/write operation method for reading/writing data with improved accuracy.

BACKGROUND

With development of semiconductor technology, static random access memory (SRAM) circuits have higher and higher density. To increase the circuit density, a SRAM circuit has memory units (MU) arranged in an array (for example, M columns*N rows). In the SRAM circuit, the M memory units MU in a single row use a common word line WL, and the N memory units MU in a single column use a common bit line BL and a common complementary bit line BLb. In the architecture using common bit lines, access to the memory unit MU will cause disturbance to other memory units MU in the same column or row.

In the disclosure, the positions of the memory units MU in the memory array are represented by a pair of numbers in the form of coordinates. The memory unit MU(m, n) denotes the memory unit MU located in the mth column and the nth row, wherein M, N, m, n are positive integers, m≤M and n≤N. It is supposed that the controller performs access (that is, read operation or write operation) to the memory unit MU(m, n) for illustration purposes.

The following description will explain the disturbance. FIG. 1 and the related description will show that the access to the memory unit MU(m, n) is affected by the data stored in the memory units MU(m, 1)~MU(m, n~1) and MU(m, n+1)~MU(m, N) which are located in the same mth column as the memory unit MU(m, n). Also, FIG. 2 and the related description will show that the access to the memory unit MU(m, n) is affected by the data stored in the memory units MU(1, n)~MU(m−1, n) and MU(m+1, n)~MU(M, n) which are located in the same nth row as the memory unit MU(m, n).

Please refer to FIG. 1, which is a schematic diagram illustrating disturbance occurring along a column direction in the conventional SRAM circuit by taking three memory units MU(m, n−1), MU(m, n), and MU(m, n+1) in one column as an example. As shown in FIG. 1, the memory units MU(m, n−1), MU(m, n), and MU(m, n+1) are electrically connected to a bit line BL[m] and a complementary bit line BLb[m]. The memory unit MU(m, n~1) is electrically connected to a nominal voltage line Vnominal and a word line WL[n~1]; the memory unit MU(m, n) is electrically connected to the nominal voltage line Vnominal and the word line WL[n]; and the memory unit MU(m, n+1) is electrically connected to the nominal voltage line Vnominal and the word line WL[n+1]. The nominal voltage Vnominal has a constant voltage value.

Table 1 shows the voltage level at the data terminals Q(m, n~1), Q(m, n), Q(m, n+1) and the inverted data terminals Qb(m, n~1), Qb(m, n), Qb(m, n+1) according to the data stored in the memory units MU(m, n~1), MU(m, n), MU(m, n+1). In table 1, it is supposed that the selected memory unit MU(m, n) stores the data "0b0" and the unselected memory units MU(m, n~1) and MU(m, n+1) store the data "0b1".

TABLE 1

| Memory unit | Stored data | Voltage at Data terminal Q | Voltage at inverted data terminal Qb |
|---|---|---|---|
| MU(m, n − 1) | 0b1 | Q(m, n − 1)=H | Qb(m, n − 1)=L |
| MU(m, n) | 0b0 | Q(m, n)=L | Qb(m, n)=H |
| MU(m, n + 1) | 0b1 | Q(m, n + 1)=H | Qb(m, n + 1)=L |

In the reading process, when the data stored in the selected memory unit MU(m, n) is "0b0" as shown in Table 1, the data terminal Q(m, n) has a logic low level (L), and the inverted data terminal Qb(m, n) has a logic high level (H), that is, Q(m, n)=L and Qb(m, n)=H. The logic low level (L) is corresponding to the ground voltage Gnd, and the logic high level (H) is corresponding to the nominal voltage Vnominal. While reading the data "0b0" stored in the memory unit MU(m, n), a reading current is generated between the bit line BL[m] and the data terminal Q(m, n), and between the inverted data terminal Qb(m, n) and the complementary bit line BL[m]. In an ideal situation, the voltage of the bit-line signal BL[m] should be equal to the ground voltage Gnd, and the voltage of the complementary bit-line signal BLb[m] should be equal to the nominal voltage Vnominal.

However, in a real circuit, because the unselected memory units MU(m, n~1) and MU(m, n+1) store the data "0b1", the data terminals Q(m, n~1), Q(m, n+1) have a logic high level (H), and the inverted data terminals Qb(m, n~1), Qb(m, n+1) have a logic low level (L). Therefore, a leakage current may be generated from the data terminals Q(m, n~1), Q(m, n+1) of the unselected memory units MU(m, n~1), MU(m, n+1) to the bit line BL[m]; and another leakage current may be generated from the complementary bit line BLb[m] to the inverted data terminals Qb(m, n~1), Qb(m, n+1) of the unselected memory units MU(m, n~1), MU(m, n+1). Therefore, the leakage current flowing to the bit line BL[m] pulls the voltage of the bit-line signal BL[m] to be slightly higher than the ground voltage Gnd. Similarly, the leakage current flowing from the complementary bit line BLb[m] pushes the voltage of the complementary bit-line signal BLb[m] to be slightly lower than the nominal voltage Vnominal.

So, even though the memory units MU(m, n~1) and MU(m, n+1) are not selected, the memory units MU(m, n~1) and MU(m, n+1) have the leakage current which pulls up the voltage of the bit-line signal BL[m] and pushes down the voltage of the complementary bit-line signal BLb[m] when the memory unit MU(m, n) stores different data from the memory units MU(m, n~1) and MU(m, n+1). The leakage current affects the voltage difference between the bit-line signal BL[m] and the complementary bit-line signal BLb[m].

If the data stored in the memory unit MU(m, n) is "0b0", the voltage at the bit line BL[m] and the voltage at the complementary bit line BLb[m] should form an inequation BL[m]<BLb[m]. However, in the real circuit, the leakage current pulls up the voltage of the bit-line signal BL[m] and pushes down the voltage of the complementary bit-line signal BLb[m] so that the inequation of the voltages of the bit-line signal BL[m] and the complementary bit-line signal BLb[m] becomes BL[m]>BLb[m]. Therefore, the data may be misjudged as "0b1" when the controller reads the data ("0b0") stored in the memory unit MU(m, n) according to the bit-line signal BL[m] and the complementary bit-line signal BLb[m].

It is realized From FIG. 1 that the access to the memory unit MU(m, n) may be disturbed by other memory units MU(m, 1)~MU(m, n~1) and MU(m, n+1)~MU(m, N) located in the same column. In other words, the controller misjudges the data stored in the memory unit MU(m, n) during the read operation because the memory unit MU(m, n) uses the same bit line BL[m] and complementary bit line BLb[m] as the unselected memory units MU(m, 1)~MU(m, n~1) and MU(m, n+1)~MU(m, N) located in the same column. Such a phenomenon is called leakage disturbance in the disclosure.

Please refer to FIG. 2, which is a schematic diagram illustrating disturbance occurring along a row direction in the conventional SRAM circuit by taking two memory units MU(m, n) and MU(m+1, n) in one row as an example. During the access to the memory unit MU(m, n), the controller connects the word line WL[n] to a logic high level (H) to switch on the selection transistor selM(m, n) and the inverted selection transistor selMb(m, n) of the memory unit MU(m, n). The controller performs the read operation or write operation by means of the turned-on selection transistor selM(m, n), the turned-on inverted selection transistor selMb(m, n), the bit-line signal BL[m], and the complementary bit-line signal BLb[m].

The selection transistor selM(m, n) and the inverted selection transistor selMb(m, n) are switched on when the word line WL[n] has a logic high level (H). In the disclosure, the logic high level (H) of the word line WL[n] is considered an enable level, and the logic low level (L) of the word line WL[n] is considered a disable level. In real applications, the type and the operation of the selection transistor selM(m, n) and the inverted selection transistor selMb(m, n) may bring the different definitions of the enable/disable level of the word line WL[n], and the disclosure is not limited to the embodiments.

Because the memory units MU(m, n) and MU((m+1), n) are both located in the nth row, during the access to the memory unit MU(m, n), the selection transistor selM(m+1, n) and the inverted selection transistor selMb(m+1, n) of the unselected memory unit MU(m+1, n) are also switched on or partially switched on due to the logic high level (H) of the word line WL[n]. The (partially) turned-on selection transistor selM(m+1, n) and the (partially) turned-on inverted selection transistor selMb(m+1, n) of the memory unit MU(m+1, n) may affect the voltages at the data terminal Q(m+1, n) and the inverted data terminal Qb(m+1, n) so as to disturb the data stored in the memory unit MU(m+1, n).

As described above, during the access to the memory unit MU(m, n), the enabled word line WL[n] may disturb the data stored in the memory units MU(1, n)~MU((m−1), n) and MU(m+1, n)~MU(M, N) located in the same row. In other words, the data stored in the unselected memory units MU(1, n)~MU((m−1), n) and MU(m+1, n)~MU(M, N) which are located in the same nth row as the selected memory unit MU(m, n) are affected due to the logic high level (H) of the word line WL[n]. Such a phenomenon is called half-select disturbance in the disclosure.

SUMMARY

The disclosure is directed to an SRAM circuit and associated read/write operation method. A row selection voltage selected from one of two supply voltages for reading/writing the memory unit is provided in the SRAM circuit and associated read/write operation method. Such a step of dynamically adjusting the row selection voltage can ensure the data accuracy of the memory unit.

According to one embodiment, an SRAM circuit is provided. The SRAM circuit includes memory units, M bit lines, N row-voltage selection line, N word lines, and a control circuit. The memory units are arranged in M columns and N rows. Each bit line is electrically connected to N memory units located in a corresponding column. Each row-voltage selection line is electrically connected to M memory units located in a corresponding row. Each word line is electrically connected to the M memory units located in the corresponding row. The control circuit includes a controller, a voltage source, a voltage selection module, a word-line driving module, and a bit-line driving module. The voltage source provides a first voltage and a second voltage. The voltage selection module is electrically connected to the controller, the voltage source, and the N row-voltage selection lines. The voltage selection module selectively transmits one of the first voltage and the second voltage to at least an nth row-voltage selection line, and transmits the second voltage to the row-voltage selection lines except the at least nth row-voltage selection line. The word-line driving module is electrically connected to the controller and the N word lines. The bit-line driving module is electrically connected to the controller and the M bit lines. The variables M, N, and n are positive integers, and n is smaller than or equal to N.

According to another embodiment, a read operation method of an SRAM circuit is provided. The static random access memory circuit includes a control circuit and memory units arranged in M columns and N rows. Each row includes M memory units electrically connected to a corresponding row-voltage selection line and a corresponding word line. Each column includes N memory units electrically connected to a corresponding bit line. The control circuit receives a memory address from a host circuit, wherein the memory address is associated with a selected memory unit located in an mth column and an nth row. The control circuit enables an nth word line and enables a sense amplifier connected to an mth bit line during a read period. The control circuit connects an nth row-voltage selection line to a first voltage during a boost period. The control circuit connects the nth row-voltage selection line to a second voltage after the boost period. The sense amplifier converts a bit-line signal transmitted from the mth bit line into read data to be transmitted to the host circuit. The variables M, N, m, and n are positive integers, m is smaller than or equal to M, and n is smaller than or equal to N.

According to a further embodiment, a write operation method of an SRAM circuit is provided. The static random access memory circuit includes a control circuit and memory units arranged in M columns and N rows. Each row includes M memory units electrically connected to a corresponding row-voltage selection line and a corresponding word line. Each column includes N memory units electrically connected to a corresponding bit line. The control circuit receives write data and a memory address from a host circuit, wherein the memory address is associated with a selected memory unit located in an mth column and an nth row. The control circuit sets a write voltage of an mth bit line according to the write data during a data setting period. The control circuit enables an nth word line and stores the write data in the selected memory unit according to the write voltage of the mth bit line during a unit write period, wherein the unit write period follows the data setting period. The control circuit connects an nth row-voltage selection line to a first voltage during a boost period, wherein the boost period is included in the unit write period. The control circuit connects the nth row-voltage selection line to a second voltage after the boost period. The variables M, N, m, and n are positive integers, m is smaller than or equal to M, and n is smaller than or equal to N.

Figure 1:
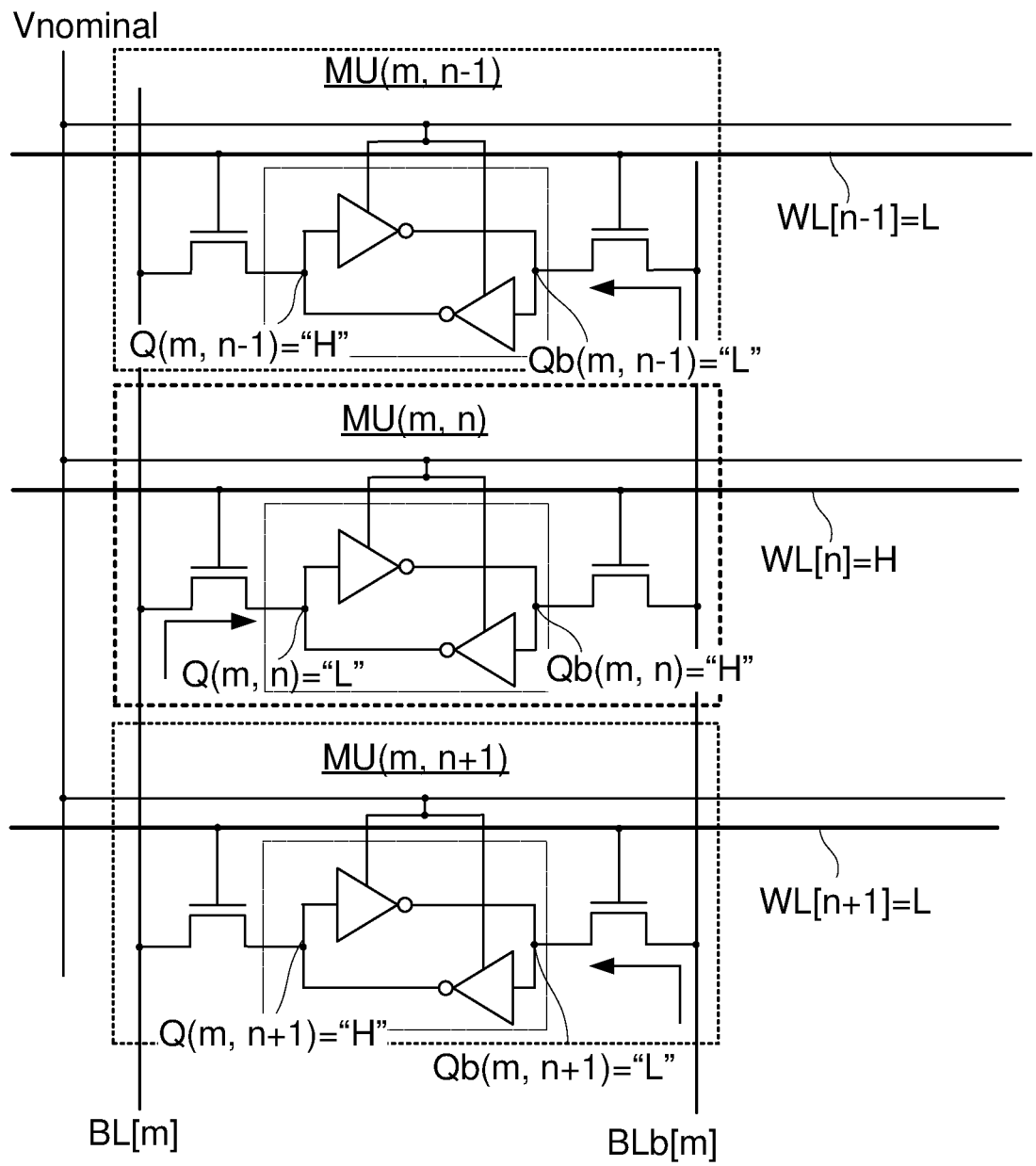
FIG. 1 (Prior Arts) is a schematic diagram illustrating disturbance occurring along a column direction in the conventional SRAM circuit by taking three memory units MU(m, n~1), MU(m, n), and MU(m, n+1) in one column as an example.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 3:
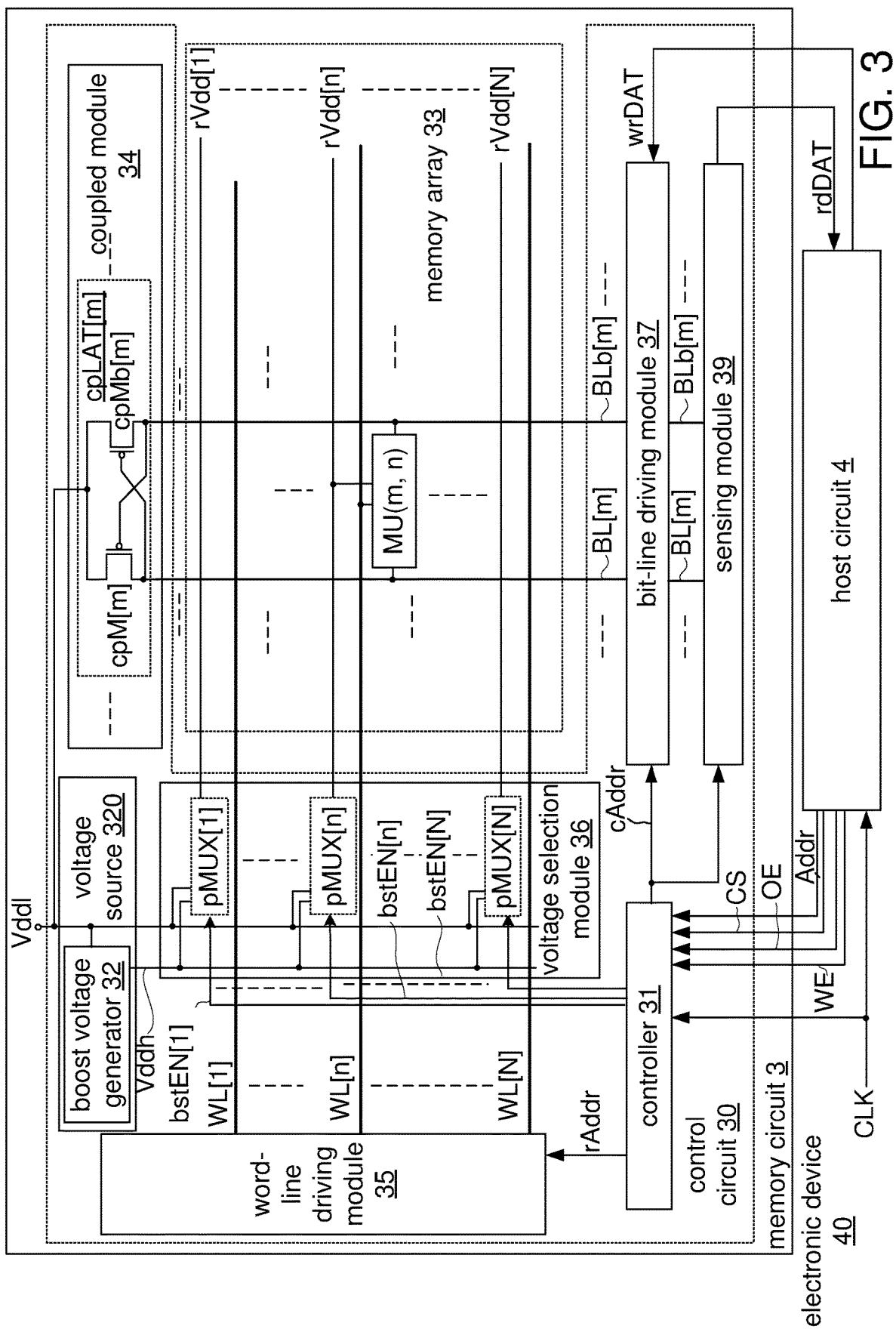
FIG. 3 is a block diagram of an electronic device according to an embodiment of the disclosure.

Please refer to FIG. 3, which is a block diagram of an electronic device according to an embodiment of the disclosure. The electronic device 40 includes a memory circuit 3 and a host circuit 4. The memory circuit 3 includes M bit lines BL[1]~BL[M], M complementary bit lines BLb[1]~BLb[M], N word lines WL[1]~WL[N], N row-voltage selection lines rVdd[1]~rVdd[N], a control circuit 30 and a memory array 33. The memory array 33 uses static random access memories (SRAM).

The memory array 33 includes M*N memory units arranged in M columns and N rows, wherein M and N are positive integers. The memory units MU(1, 1)~MU(M, N) have similar interior elements. The memory units MU(1, 1)~MU(M, N) in the first to Mth columns are electrically connected to the first to Mth bit lines BL[1]~BL[M] and the first to Mth complementary bit lines BLb[1]~BLb[M], respectively. The memory units MU(1, 1)~MU(M, N) in the first to Nth rows are electrically connected to the first to Nth word lines WL[1]~WL[N] and the first to Nth row-voltage selection lines rVdd[1]~rVdd[N], respectively. For example, the memory unit MU(m, n) is electrically connected to the bit line BL[m], the complementary bit line BLb[m], the word line WL[n], and the row-voltage selection line rVdd[n].

The control circuit 30 further includes a controller 31, a word-line driving module 35, a voltage source 320, a voltage selection module 36, a coupled module 34, a bit-line driving module 37, and a sensing module 39. The voltage source 320 includes a boost voltage generator 32. The voltage source 320 has a dual-voltage supply Vddl and Vddh, wherein Vddl<Vddh.

The host circuit 4 transmits memory access addresses Addr and control signals (for example, chip select signal CS, output enable signal OE, and write enable signal WE) to the memory circuit 3. The signal types, signal correlation, and control rules related to the memory circuit 3 and the host circuit 4 vary with applications and are not limited. In a concise manner, a symbol may denote a signal line or a signal transmitted through the signal line according to the context. For example, OE may denote the output enable line, or the output enable signal.

It is supposed in the disclosure that the chip select signal CS, the output enable signal OE and the write enable signal WE are active low signals. Concretely speaking, when the host circuit 4 sets the chip select signal CS to the logic low level (L), it represents that the host circuit 4 selects the memory circuit 3 for the access. When the host circuit 4 sets the output enable signal OE to the logic low level (L), the memory circuit 3 loads the write data wrDAT. When the host circuit 4 sets the output enable signal OE to the logic high level (H), the data write line has a high impedance (high Z).

When the host circuit 4 sets the write enable signal WE to the logic low level (L), the host circuit 4 performs the write operation on the memory circuit 3. When the host circuit 4 sets the write enable signal WE to the logic high level (H), the host circuit 4 performs read operation on the memory circuit 3.

When the host circuit 4 performs the write operation on the memory circuit 3, the host circuit 4 transmits the write data wrDAT to the memory circuit 3 through the bit-line driving module 37, the bit lines BL and the complementary bit lines BLb. When the host circuit 4 performs the read operation on the memory circuit 3, the memory circuit 3 transmits the read data rdDAT to the host circuit 4 through the bit lines BL, the complementary bit lines BLb and the sensing module 39. The write data wrDAT and the read data rdDAT share the data lines. The memory circuit 3 and the host circuit 4 receive the clock signal CLK. The disclosure does not limit the source of the clock signal CLK.

The controller 31 is electrically connected to the word-line driving module 35, the voltage selection module 36, the bit-line driving module 37, and the sensing module 39. The word-line driving module 35 is electrically connected to the word lines WL[1]~WL[N]. The bit-line driving module 37 is electrically connected to the bit lines BL[1]~BL[M], the complementary bit lines BLb[1]~BLb[M], and the host circuit 4. The sensing module 39 is electrically connected to the controller 31, the bit lines BL[1]~BL[M], the complementary bit lines BLb[1]~BLb[M], and the host circuit 4. The sensing module 39 includes sense amplifiers whose number is determined according to the number (M) of columns of the memory units and the use of multiplexers.

After receiving the memory access address Addr from the host circuit 4, the controller 31 decodes the memory access address Addr to generate a column address cAddr and a row address rAddr. The controller 31 transmits the column address cAddr to the bit-line driving module 37 and the sensing module 39, and transmits the row address rAddr to the word-line driving module 35. Afterward, the bit-line driving module 37 or the sensing module 39 uses the bit-line signals BL[1]~BL[M] and the complementary bit-line signals BLb[1]~BLb[M] according to the column address cAddr to read or write data. The word-line driving module 35 generates the word-line signals WL[1]~WL[N] according to the row address rAddr. The controller 31 generates and transmits the boost enable signals bstEN[1]~bstEN[N] to the voltage selection module 36. The memory units MU(1, 1)~MU(M, N) in the first to Nth rows are electrically connected to the row-voltage selection lines rVdd[1]~rVdd[N], respectively.

The coupled module 34 includes M latch circuits cpLAT[1]~cpLAT[M]. The latch circuits cpLAT[1]~cpLAT[M] correspond to the memory units MU(1, 1~N)~MU(M, 1~N) in the first to Mth columns. The latch circuits cpLAT[1]~cpLAT[M] have similar architecture, and only one latch circuit cpLAT[m] is illustrated herein. The latch circuit cpLAT[m] includes a latch transistor cpM[m] and an inverted latch transistor cpMb[m]. The source terminals of the latch transistor cpM[m] and the inverted latch transistor cpMb[m] are electrically connected to the supply voltage Vddl; the gate terminal of the latch transistor cpM[m] is electrically connected to the drain terminal of the inverted latch transistor cpMb[m]; and the drain terminal of the latch transistor cpM[m] is electrically connected to the gate terminal of the inverted latch transistor cpMb[m].

The boost voltage generator 32 receives the supply voltage Vddl to generate the supply voltage Vddh. The supply voltage Vddh is higher than the supply voltage Vddl (Vddh>Vddl). For example, the ratio of the supply voltage Vddh to the supply voltage Vddl is 1.5 (Vddh=1.5*Vddl). Alternatively, the ratio of the supply voltage Vddh to the supply voltage Vddl ranges from 1.1 to 1.5 (1.1*Vddl<Vddh<1.5*Vddl). The boost voltage generator 32 transmits the supply voltage Vddh to the voltage selection module 36. The voltage selection module 36 includes N voltage selectors pMUX[1]~pMUX[N]. The voltage selectors pMUX[1]~pMUX[N] are electrically connected to the row-voltage selection lines rVdd[1]~rVdd[N], respectively.

The voltage selectors pMUX[1]~pMUX[N] are all electrically connected to the controller 31. The controller 31 transmits the boost enable signals bstEN[1]~bstEN[N] to the voltage selectors pMUX[1]~pMUX[N], respectively. Each voltage selector pMUX[1]~pMUX[N] selects and transmits one supply voltage Vddh, Vddl to the corresponding row-voltage selection line rVdd[1]~rVdd[N] in response to the voltage level of the corresponding boost enable signal bstEN[1]~bstEN[N]. The voltage selectors pMUX[1]~pMUX[N] have similar interior circuits, circuit connections, and operation mechanisms. The following description takes the voltage selector pMUX[n] as an example.

Figure 4:
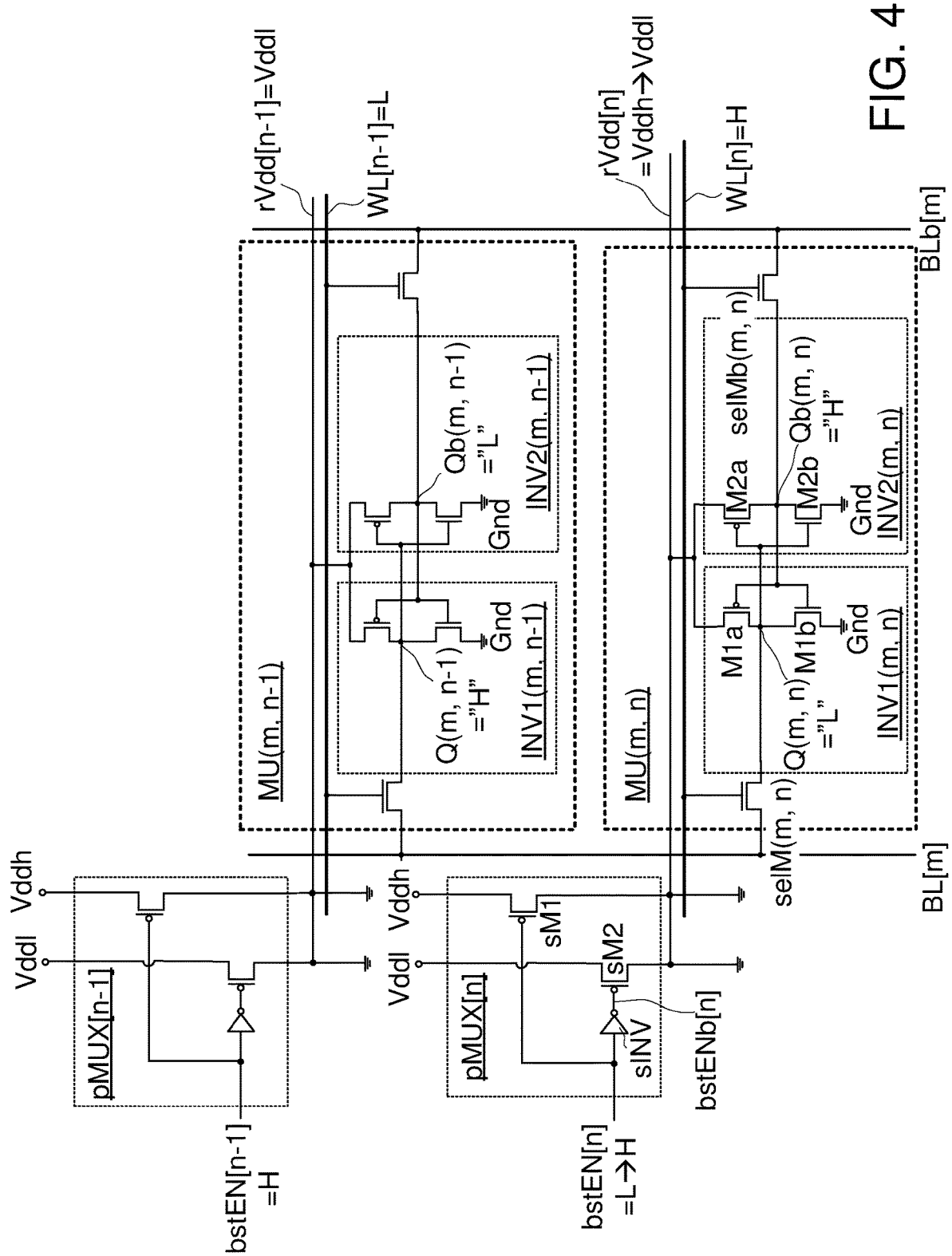
FIG. 4 is a circuit diagram showing that a 6T dual-port SRAM memory unit MU(m, n) cooperates with a voltage selector implemented by PMOS transistors.

Please refer to FIG. 4, which is a circuit diagram showing that a 6T dual-port SRAM memory unit MU(m, n) cooperates with a voltage selector implemented by PMOS transistors. In this diagram, only the memory units MU(m, n~1), MU(m, n) and the voltage selectors pMUX[n~1], pMUX[n] are shown. It is supposed that the data stored in the memory unit MU(m, n~1) is "0b1", and the data stored in the memory unit MU(m, n) is "0b0". The interior circuits of the voltage selector pMUX[n] and the memory unit MU(m, n) are described below.

In FIG. 4, the voltage selector pMUX[n] includes PMOS transistors sM1, sM2 and a selection invertor sINV. The selection inverter sINV receives the boost enable signal bstEN[n] and generates an inverted boost enable signal bstENb[n]. The source terminal and the drain terminal of the PMOS transistor sM1 are electrically connected to the supply voltage lines Vddh and the row-voltage selection line rVdd[n], respectively. The source terminal and the drain terminal of the PMOS transistor sM2 are electrically connected to the supply voltage line Vddl and the row-voltage selection line rVdd[n], respectively. The gate terminals of the PMOS transistors sM1 and sM2 are electrically connected to the input terminal and the output terminal of the selection inverter sINV, respectively.

The PMOS transistor sM1 is selectively switched on in response to the voltage level of the boost enable signal bstEN[n], and the PMOS transistor sM2 is selectively switched on in response to the voltage level of the inverted boost enable signal bstENb[n]. Since the boost enable signal bstEN[n] and the inverted boost enable signal bstENb[n] have opposite voltage levels, either the PMOS transistor sM1 or the PMOS transistor sM2 is switched on. When the PMOS transistor sM1 is switched on, the row-voltage selection line rVdd[n] receives the supply voltage Vddh from the voltage selector pMUX[n]. On the contrary, when the PMOS transistor sM2 is switched on, the row-voltage selection line rVdd[n] receives the supply voltage Vddl from the voltage selector pMUX[n].

In FIG. 4, the latch inverter INV1(m, n) includes a PMOS transistor M1a and an NMOS transistor M1b; and the latch inverter INV2(m, n) includes a PMOS transistor M2a and an NMOS transistor M2b. The memory unit MU(m, n) includes six transistors, and thus the memory unit MU(m, n) in FIG. 4 is called a 6T dual-port SRAM memory unit.

The source terminals of the PMOS transistors M1a and M2a are electrically connected to the row-voltage selection line rVdd[n]; and the source terminals of the NMOS transistors M1b and M2b are electrically connected to the ground voltage Gnd. The drain terminal of the PMOS transistor M1a is electrically connected to the drain terminal of the NMOS transistor M1b, and the drain terminal of the PMOS transistor M2a is electrically connected to the drain terminal of the NMOS transistor M2b. The gate terminals of the PMOS transistor M1a and the NMOS transistor M1b are electrically connected to the inverted data terminal Qb(m, n). The gate terminals of the PMOS transistor M2a and the NMOS transistor M2b are electrically connected to the data terminal Q(m, n).

When the controller 31 performs access to the memory unit MU(m, n) in FIG. 4, the controller 31 controls the bit-line driving module 37 to set the word-line signal WL[n~1] to the logic low level (L) and set the word-line signal WL[n] to the logic high level (H). In addition, the controller 31 sets the boost enable signal bstEN[n~1] having the logic high level (H) (bstEN[n~1]=H) so as to maintain the row selection voltage rVdd[n~1] at the supply voltage Vddl. On the other hand, during the access to the memory unit MU(m, n), the boost enable signal bstEN[n] generated by the controller 31 is switched from the logic low level (L) to the logic high level (H). Therefore, when the boost enable signal bstEN[n]=L, the row selection voltage rVdd[n] uses the supply voltage Vddh. Afterward, when the boost enable signal bstEN[n]=H, the row selection voltage rVdd[n] uses the supply voltage Vddl.

Figure 5:
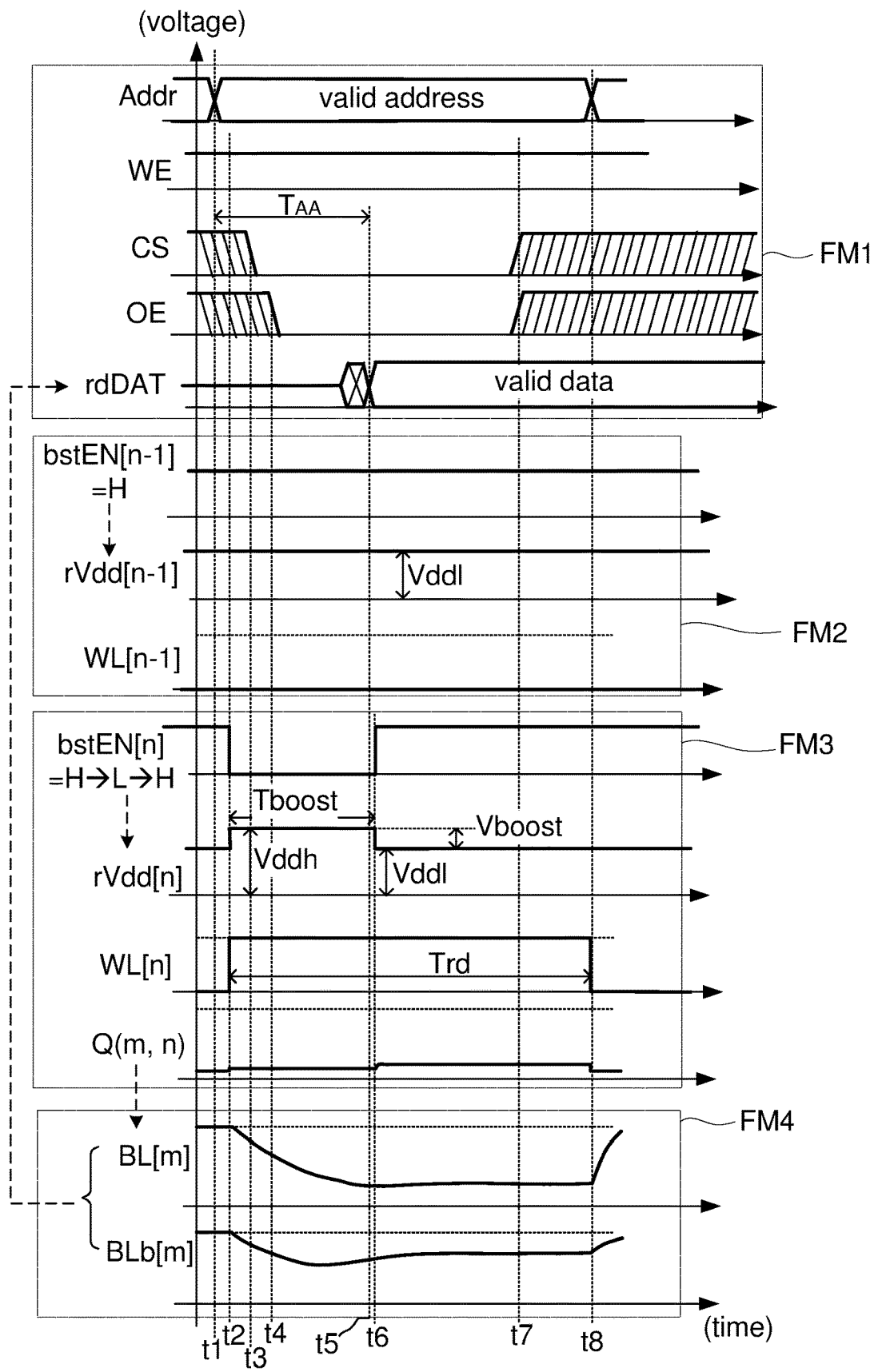
FIG. 5 is a wave graph showing related waves of the SRAM memory unit during the read operation according to an embodiment of the disclosure.

Please refer to FIG. 5, which is a wave graph showing related waves of the SRAM memory unit during the read operation according to an embodiment of the disclosure. In this diagram, voltage is on the vertical axis and time is on the horizontal axis.

Please refer to both FIGS. 4 and 5. The waves in FIG. 5 are classified as indicated in four blocks FM1, FM2, FM3, and FM4 in sequence.

The waves contained in the block FM1 are signals transmitted between the host circuit 4 and the memory circuit 3. These waves include the memory access address Addr, the write enable signal WE, the chip select signal CS, the output enable signal OE, and the read data rdDAT.

The host circuit 4 uses the memory access address Addr to transmit a valid address between the time points t1 and t8. The write enable signal WE changes as the host circuit 4 changes the operation type (for example, the read operation or the write operation). If the current operation has the same operation type as the previous operation, the write enable signal WE is not alerted. In this diagram, it is supposed that the current operation is read operation, the same as the previous operation. Because the write enable signal WE is an active low signal, the write enable signal WE maintains at the high logic level. The host circuit 4 sets the chip select signal CS (active low signal) to the logic low level between the time points t3 and t7, and sets the output enable signal OE (active low signal) to the logic low level between the time points t4 and t7. After the time point t7, the host circuit 4 does not set the voltage level of the chip select signal CS and the output enable signal OE, and thus the chip select signal CS and the output enable signal OE have high impedances. The read data rdDAT is provided from the time point t5 and does not change its content until the next read operation for reading the next read data rdDAT.

The memory circuit 3 starts to transmit valid data through the read data line rdDAT after the time point t5. The time interval between the start time point (that is, the time point t1) of transmitting the valid address and the start time point (that is, the time point t5) of transmitting the valid data is defined as an address access period $T_{AA}$.

The waves contained in the block FM2 are signals related to the memory units MU(1~M, (n~1)) located in the (n~1)th row. These waves include the boost enable signal bstEN[n~1], the row selection voltage rVdd[n~1] and the word-line signal WL[n~1]. In this diagram, the boost enable signal bstEN[n~1] maintains the logic high level (H); the row selection voltage rVdd[n~1] uses the supply voltage Vddl; and the word-line signal WL[n~1] maintains the logic low level (L).

The waves contained in the block FM3 are signals related to the memory units MU(1~M, n) located in the nth row. These waves include the boost enable signal bstEN[n], the row selection voltage rVdd[n], the word-line signal WL[n], and the voltage at the data terminal Q(m, n).

The boost enable signal bstEN[n] has the logic high level (H) before the time point t2, has the logic low level (L) between the time points t2 and t6, and has the logic high level (H) after the time point t6. The time period that the boost enable signal bstEN[n] has the logic low level (L) is defined as a boost period Tboost. According to the disclosure, the boost period Tboost and the address access period $T_{AA}$ satisfy the condition of $T_{AA} \leq Tboost$. In other words, the boost period Tboost is longer than the address access period $T_{AA}$, or the boost period Tboost and the address access period $T_{AA}$ are of equal length.

Because the row selection voltage rVdd[n] varies with the voltage level of the boost enable signal bstEN[n], the row selection voltage rVdd[n] uses the supply voltage Vddl before the time point t2; uses the supply voltage Vddh between the time points t2 and t6 (the boost period Tboost) and has the supply voltage Vddl after the time point t5. The supply voltage Vddh is the sum of the supply voltage Vddl and the boost voltage Vboost, that is, Vddh=Vddl+Vboost. It is obtained that the row selection voltage rVdd[n] varies with the boost enable signal bstEN[n]. When the boost enable signal bstEN[n] has the logic high level (H), the controller 31 uses the voltage selection module 36 to set the row selection voltage rVdd[n] to the supply voltage Vddl. When the boost enable signal bstEN[n] has the logic low level (L), the controller 31 uses the voltage selection module 36 to set the row selection voltage rVdd[n] to the supply voltage Vddh.

After the host circuit 4 transmits the memory access address Addr to the controller 31 since the time point t1, the controller 31 decodes the memory access address Addr to get the column (m) and the row (n) of the selected memory unit MU(m, n). Therefore, the rising time point (that is, the time point t2) of the word-line signal WL[n] is slightly later than the start time point (that is, the time point t1) of transmitting the memory access address Addr.

The word-line signal WL[n] has the logic low level (L) before the time point t2, has the logic high level (H) between the time points t2 and t8, and has the logic low level (L) after the time point t8. In the disclosure, the time period that the controller 31 performs the read operation on the memory unit MU(m, n) is defined as a read period Trd. The boost period Tboost is shorter than the read period Trd. The word-line signal WL[n] is set to the logic high level (H) during the read period Trd.

Please refer to FIG. 4 and the waves in FIG. 5. It is supposed, as the example given in FIG. 1, that the data stored in the selected memory unit MU(m, n) is "0b0", and the data stored in the unselected memory unit MU(m, n~1) is "0b1". During the boost period Tboost (between the time points t2 and t6), the row selection voltage rVdd[n] uses the supply voltage Vddh. Therefore, the source terminals of the PMOS transistor M1a of the latch inverter INV1(m, n) and the PMOS transistor M2a of the latch inverter INV2(m, n) receive the higher supply voltage Vddh during the boost period Tboost (the early portion of the read period Trd).

When the row selection voltage rVdd[n] uses the supply voltage Vddh, there is a higher voltage difference between the source terminal and the gate terminal of the PMOS transistor M2a of the memory unit MU(m, n) so that a greater current flows to the inverted data terminal Qb(m, n). Therefore, the inverted data terminal Qb(m, n) maintains a higher voltage. Thus, when the inverted selection transistor selMb(m, n) is switched on, the voltage drop at the inverted data terminal Qb(m, n) of the selected memory unit MU(m, n) due to the leakage current towards the unselected memory unit MU(m, n~1) through the complementary bit line BLb[m] is reduced. Hence, the architecture of FIG. 4 can keep the voltage at the complementary bit line BLb[m] insensitive to the current leakage so that a more stable voltage at the complementary bit line BLb[m] could be sensed by the sensing module 39.

Because the latch inverters INV1($m, n$) and INV2($m, n$) form a bistable latch, when the inverted data terminal Qb(m, n) maintains the higher voltage, the PMOS transistor M1$a$ is switched off. There is a higher voltage difference between the gate terminal and the source terminal of the NMOS transistor M1$b$. Accordingly, the data terminal Q(m, n) maintains the ground voltage Gnd. Therefore, even though the bit line BL[m] receives the leakage current from the memory units MU(m, n~1), MU(m, n+1), the leakage current just pulls up the voltage at the data terminal Q(m, n) slightly. Also, by using the architecture of the memory circuit, the voltage of the bit-line signal BL[m] sensed by the sensing module 39 substantially approximates the ground voltage Gnd.

In other words, if the row selection voltage rVdd[n] receives the supply voltage Vddh during the boost period Tboost, the PMOS transistor M1$a$ and the NMOS transistor M2$b$ are towards the turned-off state to latch the data in the memory unit MU(m, n). Therefore, the voltage at the data terminal Q(m, n) does not rise during the read period Trd. The voltage at the data terminal Q(m, n) substantially approximates to the ground voltage Gnd within the read period Trd. After the read data line rdDAT starts to transmit the valid data, the row selection voltage rVdd[n] changes to use the supply voltage Vddl.

The waves contained in the block FM4 include the bit-line signal BL[m] and the complementary bit-line signal BLb[m]. The bit-line signal BL[m] falls gradually to a lower voltage close to the ground voltage Gnd during the read period Trd. The complementary bit-line signal BLb[m] falls slightly in the beginning, and then rises to a higher voltage close to the supply voltage Vddl. Therefore, the bit-line signal BL[m] and the complementary bit-line signal BLb[m] satisfy the condition of BL[m]<BLb[m]. The voltage difference between the bit-line signal BL[m] and the complementary bit-line signal BLb[m] sensed by the sense amplifier actually reflects the data "0b0" stored in the memory unit MU(m, n).

Then, the sense amplifier amplifies the voltage difference between the bit-line signal BL[m] and the complementary bit-line signal BLb[m] to generate and transmit the read data rdDAT to the host circuit 4 wherein the voltage difference represents the data stored in the memory unit MU(m, n). Because the sensing module 39 can latch data, once the read data rdDAT output by the sensing module 39 becomes steady, the controller 31 does not need to maintain the voltage levels of the chip select signal CS and the output enable signal OE. In FIG. 5, the chip select signal CS and the output enable signal OE have high impendence after the time point t7.

The above embodiment gives the operation of the 6T dual-port memory unit MU(m, n). It is to be noted that the disclosure does not limit the number of the ports and the transistors in one memory unit MU(m, n). The number of ports of the memory unit MU(m, n) will alter the sensing (sources) along the column direction, but will not affect the control along the row direction.

Taking the read operation as an example, if the memory unit MU(m, n) is dual-ported, the sensing module 39 determines whether the data stored in the memory unit MU(m, n) is "0b0" or "0b1" by sensing the voltage difference between the bit-line signal BL[m] and the complementary bit-line signal BLb[m]. If the memory unit MU(m, n) is single-ported, the sensing module 39 determines whether the data stored in the memory unit MU(m, n) is "0b0" or "0b1" by directly sensing the bit-line signal BL[m]. On the other hand, the number of the ports does not affect the controller 31 in controlling the voltage selectors pMUX[1]~pMUX[N] and the row selection voltages rVdd[1]~rVdd[N] along the row direction.

Figure 6A:
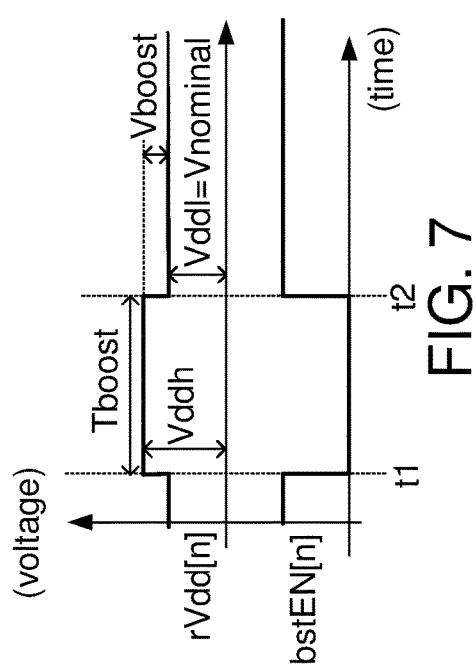
FIG. 6A is a circuit diagram showing that a 5T single-port SRAM memory unit MU(m, n) cooperates with a voltage selector pMUX[n]' implemented by NMOS transistors.

Please refer to FIG. 6A, which is a circuit diagram showing that a 5T single-port SRAM memory unit MU(m, n) cooperates with a voltage selector pMUX[n]' implemented by NMOS transistors. The voltage selector pMUX[n]' includes NMOS transistors sM1', sM2', and a selection inverter sINV' The selection inverter sINV' receives the boost enable signal bstEN[n] and generates an inverted boost enable signal bstENb[n]. In FIG. 6A, the NMOS is selectively switched on according to the voltage level of the transistor sM1' inverted boost enable signal bstENb[n], and the NMOS transistor sM2' is selectively switched on according to the voltage level of the boost enable signal bstEN[n]. Since the inverted boost enable signal bstENb[n] and the boost enable signal bstEN[n] have opposite voltage levels, either the NMOS transistor sM1' or the NMOS transistor sM2' is switched on while the other NMOS transistor is switched off. When the NMOS transistor sM1' is switched on and the NMOS transistor sM2' is switched off (bstEN[n]=L, bstENb[n]=H), the row selection voltage rVdd[n] uses the supply voltage Vddh. On the contrary, when the NMOS transistor sM1' is switched off and the NMOS transistor sM2' is switched on (bstEN[n]=H, bstENb[n]=L), the row selection voltage rVdd[n] uses the supply voltage Vddl.

Figure 6B:
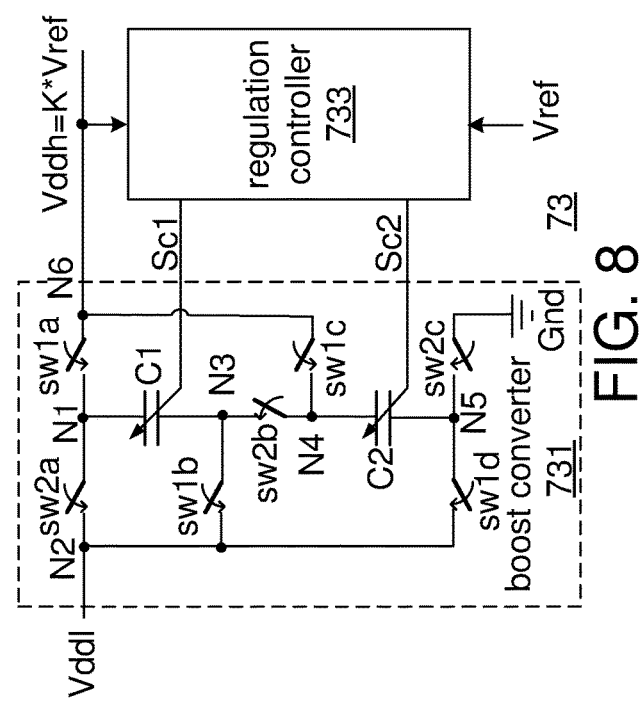
FIG. 6B is a circuit diagram showing that a 5T single-port SRAM memory unit MU(m, n) cooperates with a voltage selector pMUX[n]" implemented by PMOS transistors.

Please refer to FIG. 6B, which is a circuit diagram showing that a 5T single-port SRAM memory unit MU(m, n) cooperates with a voltage selector pMUX[n]" implemented by PMOS transistors. The voltage selector pMUX[n]" includes PMOS transistors sM1", sM2" and a selection inverter sINV". The selection inverter sINV" receives the boost enable signal bstEN[n] and generates an inverted boost enable signal bstENb[n]. In FIG. 6B, the PMOS transistor sM1" is selectively switched on according to the voltage level of the boost enable signal bstEN[n], and the PMOS transistor sM2" is selectively switched on according to the voltage level of the inverted boost enable signal bstENb[n]. Since the boost enable signal bstEN[n] and the inverted boost enable signal bstENb[n] have opposite voltage levels, either the PMOS transistor sM1" or the PMOS transistor sM2" is switched on while the other PMOS transistor is switched off. When the PMOS transistor sM1" is switched on and the PMOS transistor sM2" is switched off (bstEN[n]=L, bstENb[n]=H), the row selection voltage rVdd[n] uses the supply voltage Vddh. On the contrary, when the PMOS transistor sM1" is switched off and the PMOS transistor sM2" is switched on (bstEN[n]=H, bstENb[n]=L), the row selection voltage rVdd[n] uses the supply voltage Vddl.

According to the concept of the disclosure, the supply voltage Vddl is equal to the nominal voltage Vnominal (that is, Vddl=Vnominal), and the supply voltage Vddh is the sum of the supply voltage Vddl and the boost voltage Vboost (that is, Vddh=Vddl+Vboost).

Figure 7:
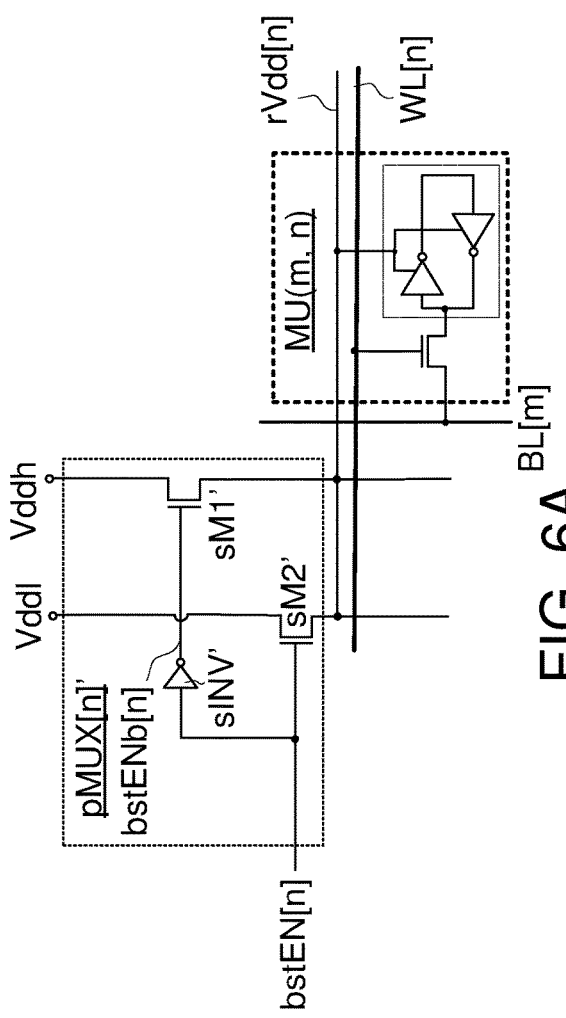
FIG. 7 is a wave graph showing related waves when the voltage selectors pMUX[n]' and pMUX[n]" in FIGS. 6A and 6B select the supply voltage Vddl, Vddh to serve as the row selection voltage in response to the boost enable signal bstEN[n].

Please refer to FIG. 7, which is a wave graph showing related waves when the voltage selectors pMUX[n]' and pMUX[n]" in FIGS. 6A and 6B select one supply voltage Vddl, Vddh, to serve as the row selection voltage in response to the boost enable signal bstEN[n]. In FIG. 7, the interval between the time points t1 and t2 is the boost period Tboost as defined above.

Please refer to both FIGS. 6A and 7. The boost enable signal bstEN[n] has a logic high level (bstEN[n]=H) during both the time periods before the time point t1 and after the time point t2. At this time, the NMOS transistor sM1' is switched off, the NMOS transistor sM2' is switched on, and the supply voltage Vddl is transmitted to the row-voltage selection line rVdd[n] through the NMOS transistor sM2'. During the boost period Tboost, the boost enable signal bstEN[n] has the logic low level (bstEN[n]=L). At this time, the NMOS transistor sM1' is switched on, the NMOS transistor sM2' is switched off, and the supply voltage Vddh is transmitted to the row-voltage selection line rVdd[n] through the NMOS transistor sM1'.

Please refer to both FIGS. 6B and 7. The PMOS transistor sM1" is switched off, and the PMOS transistor sM2" is switched on during both the time periods before the time point t1 and after the time point t2. At this time, the supply voltage Vddl is transmitted to the row-voltage selection line rVdd[n] through the PMOS transistor sM2". During the boost period Tboost (between the time points t1 and t2), the PMOS transistor sM1" is switched on, and the PMOS transistor sM2" is switched off. At this time, the supply voltage Vddh is transmitted to the row-voltage selection line rVdd[n] through the NMOS transistor sM1".

In real applications, the architecture of the voltage selector pMUX[n] and the setting value of the boost enable signal bstEN[n] corresponding to the supply voltage Vddh or Vddl are not limited to the embodiments with reference to FIGS. 4, 6A, and 6B. Modification to the interior elements and connection is also applicable on condition that the voltage selector pMUX[n] can dynamically transmit one of the supply voltages Vddh and Vddl to the row-voltage selection line rVdd[n] according to the setting value of the boost enable signal bstEN[n]. For example, the voltage selector pMUX[n] may include a PMOS transistor and an NMOS transistor without introducing any inverter. The circuit design of the modified voltage selector pMUX[n] can be derived from the provided embodiments, and further description is not required.

Figure 8:
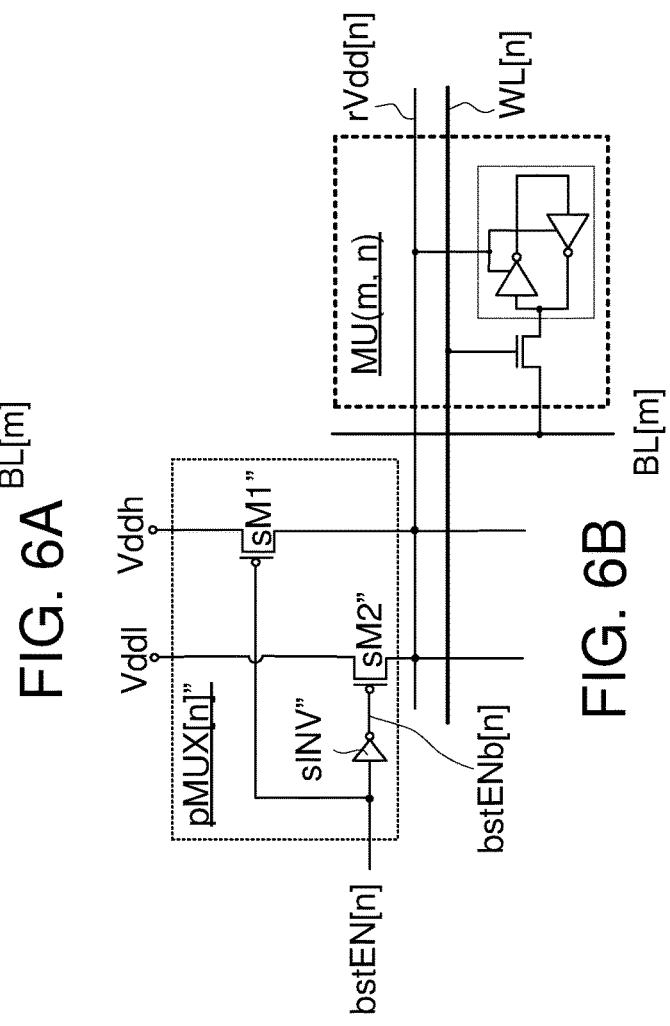
FIG. 8 is a schematic diagram illustrating a boost converter used in a closed-loop boost voltage generator according to an embodiment of the disclosure.

The boost voltage generator 32 may be an open-loop circuit or a closed-loop circuit. If the boost voltage generator 32 is implemented by an open-loop circuit, a boost converter receives the supply voltage Vddl and then converts it into the supply voltage Vddh. FIG. 8 illustrates a closed-loop boost voltage generator including a boost converter and a regulation controller. The regulation controller detects the accuracy of the supply voltage Vddh and dynamically adjusts the control signal for controlling the boost converter.

Please refer to FIG. 8, which is a schematic diagram illustrating a boost converter used in a closed-loop boost voltage generator according to an embodiment of the disclosure. Concretely speaking, FIG. 8 illustrates an embodiment of a switching capacitor DC-DC converter.

The boost voltage generator 73 includes a boost converter 731 and a regulation controller 733. The boost converter 731 includes capacitors C1, C2 and switches sw1a, sw1b, sw1c, sw1d, sw2a, sw2b, sw2c. The boost converter 731 receives the supply voltage Vddl at terminal N2 and outputs the supply voltage Vddh at terminal N6. After receiving a reference voltage Vref and the supply voltage Vddh, the regulation controller 733 generates capacitor control signals Sc1, Sc2. The connection between the switches sw1a, sw1b, sw1c, sw1d, sw2a, sw2b, sw2c and the capacitors C1, C2 are described as follows.

The switch sw2a is electrically connected between terminals N1 and N2. The switch sw1a is electrically connected between terminals N1 and N6. The switch sw1b is electrically connected between terminals N2 and N3. The switch sw1c is electrically connected between terminals N4 and N6. The switch sw1d is electrically connected between terminals N2 and N5. The switch sw2c is electrically connected between terminal N5 and the ground terminal Gnd.

The capacitor C1 is electrically connected between terminals N1 and N3, and the capacitor C1 is further electrically connected to the regulation controller 733. The capacitance of the capacitor C1 is controlled with the capacitor control signal Sc1 generated by the regulation controller 733. The capacitor C2 is electrically connected between terminals N4 and N5, and the capacitor C2 is further electrically connected to the regulation controller 733. The capacitance of the capacitor C2 is controlled with the capacitor control signal Sc2 generated by the regulation controller 733.

In the embodiment, the boost converter 731 is controlled with the switch control signals swCTL1 and swCTL2 having opposite voltage levels to operate in two operation phases PH1 and PH2. One set of the switches are controlled with the switch control signal swCTL1, and the other set of switches are controlled with the switch control signal swCTL2, as shown in Table 2.

TABLE 2

| Switch | Switch control signal | Operation phase | |
|---|---|---|---|
| | | PH1 | PH2 |
| sw1a, sw1b, sw1c, sw1d | swCTL1 | ON | OFF |
| sw2a, sw2b, sw2c | swCTL2 | OFF | ON |

Figure 9:
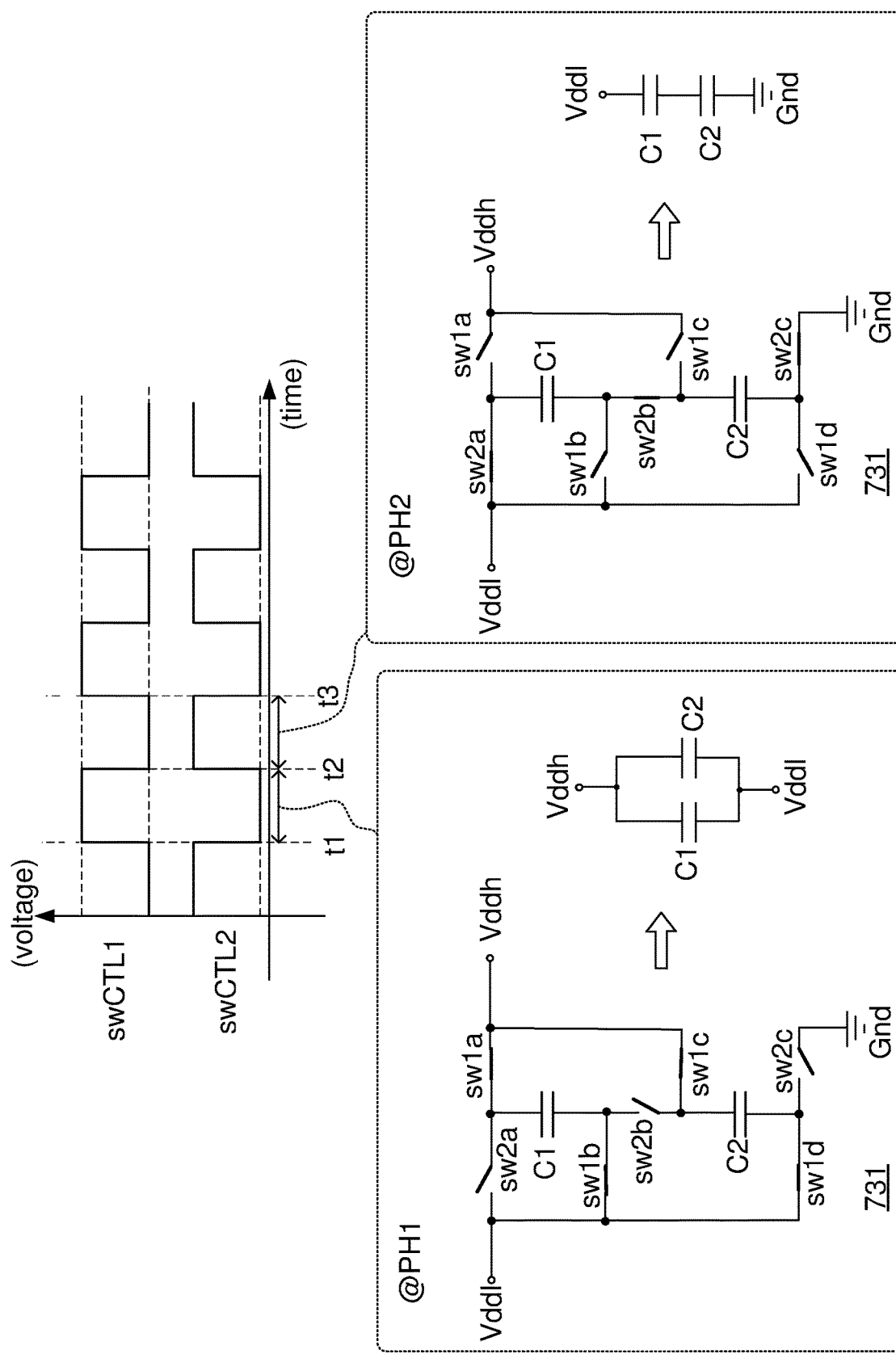
FIG. 9 is a schematic diagram illustrating that the boost voltage generator operates in different operation phases in response to the switch control signals swCTL1 and swCTL2.

Please refer to FIG. 9, which is a schematic diagram illustrating that the boost voltage generator operates in different operation phases in response to the switch control signals swCTL1 and swCTL2. Please refer to FIGS. 8, 9, and Table 2 for the following description.

When the switch control signal swCTL1 has the logic high level, and the switch control signal swCTL2 has the logic low level (for example, between the time points t1 and t2), the boost converter 731 operates in a first operation phase PH1. At this time, the switches sw1a, sw1b, sw1c, sw1d are switched on (ON), and the switches sw2a, sw2b, sw2c are switched off (OFF). Thus, the capacitors C1 and C2 are connected in parallel. Now, the boost converter 731 outputs the supply voltage Vddh.

On the contrary, when the switch control signal swCTL1 has the logic low level, and the switch control signal swCTL2 has the logic high level (for example, between the time points t2 and t3), the boost converter 731 operates in a second operation phase PH2. At this time, the switches sw1a, sw1b, sw1c, sw1d are switched off (OFF), and the switches sw2a, sw2b, sw2c are switched on (ON). Thus, the capacitors C1 and C2 are connected in series. Now, the boost converter 731 outputs the supply voltage Vddl.

In ideal conditions, the supply voltage Vddh and the reference voltage Vref meet the relation of Vddh=Vref. A comparator could be disposed in the regulation controller 733 to compare the supply voltage Vddh and the reference voltage Vref so as to adjust the capacitance of the capacitors C1 and C2. Alternatively, the regulation controller 733 could adjust the switch control signals swCTL1 and swCTL2 to control the output of the boost converter 731. In real applications, the switch control signals swCTL1 and swCTL2 could be generated by the controller 31. By setting the frequency of the switch control signals swCTL1 and swCTL2, the capacitors C1 and C2 are dynamically switched among the parallel connection and series connection to ensure that the boost converter 731 outputs the stable supply voltage Vddh.

It is to be noted that the provision or generation of the supply voltage Vddh, Vddl are not limited to the embodiments of the disclosure. For example, the voltage source 320 could directly receive external supply voltages Vddh and Vddl. Also, the architecture of the boost voltage generator is not limited, as illustrated in FIG. 9.

Please refer to FIG. 5 again. In the above embodiments, the bit-line driving module 37 controls the bit-line signals BL[1]~BL[M] according to the mth column associated with the selected memory unit MU(m, n). Before the time point t2, the controller 31 uses the bit-line driving module 37 to set the bit-line signal BL[m] and the complementary bit-line signal BLb[m] to a precharge voltage Vpre. The precharge voltage Vpre is lower than or equal to the supply voltage Vddl.

For the read operation as shown in FIG. 5, the controller 31 uses the bit-line driving module 37 to precharge the bit-line signal BL[m] and the complementary bit-line signal BLb[m] to the precharge voltage Vpre before the read period Trd (that is, before the time point t2). Similarly, for the write operation on the memory circuit 3, the controller 31 uses the bit-line driving module 37 to precharge the bit-line signal BL[m] and the complementary bit-line signal BLb[m] to the precharge voltage Vpre before the write period Twrt.

When the controller 31 performs access to the memory unit MU(m, n), the related columns are independently controlled by respective bit-line signals BL[1]~BL[M] and respective complementary bit-line signals BLb[1]~BL[M]. Therefore, before the access to the memory unit MU(m, n), the bit-line driving module 37 provides the precharge voltage to the bit line BL[m] and the complementary bit line BLb[m] corresponding to the mth column where the selected memory unit MU(m, n) is located. However, providing the precharge voltage to the bit line BL[m] and the complementary bit line BLb[m] corresponding to each column individually incurs a high cost.

To simplify the circuit, the control circuit 30 does not independently control the bit lines BL[1]~BL[M] and the complementary bit lines BLb[1]~BL[M] corresponding to the first to Mth columns during the access to the memory unit. Instead, the concept of the precharge group is used to control the voltage of the bit-line signal BL and the complementary bit-line signal BLb.

In real applications, the bit-line driving module 37 divides the M columns of the memory units into P precharge groups GRP_1~GRP_P based on the column positions. Each precharge group GRP_1~GRP_P includes Q columns of the memory units, wherein P and Q are positive integers and P*Q=M.

Figure 10:
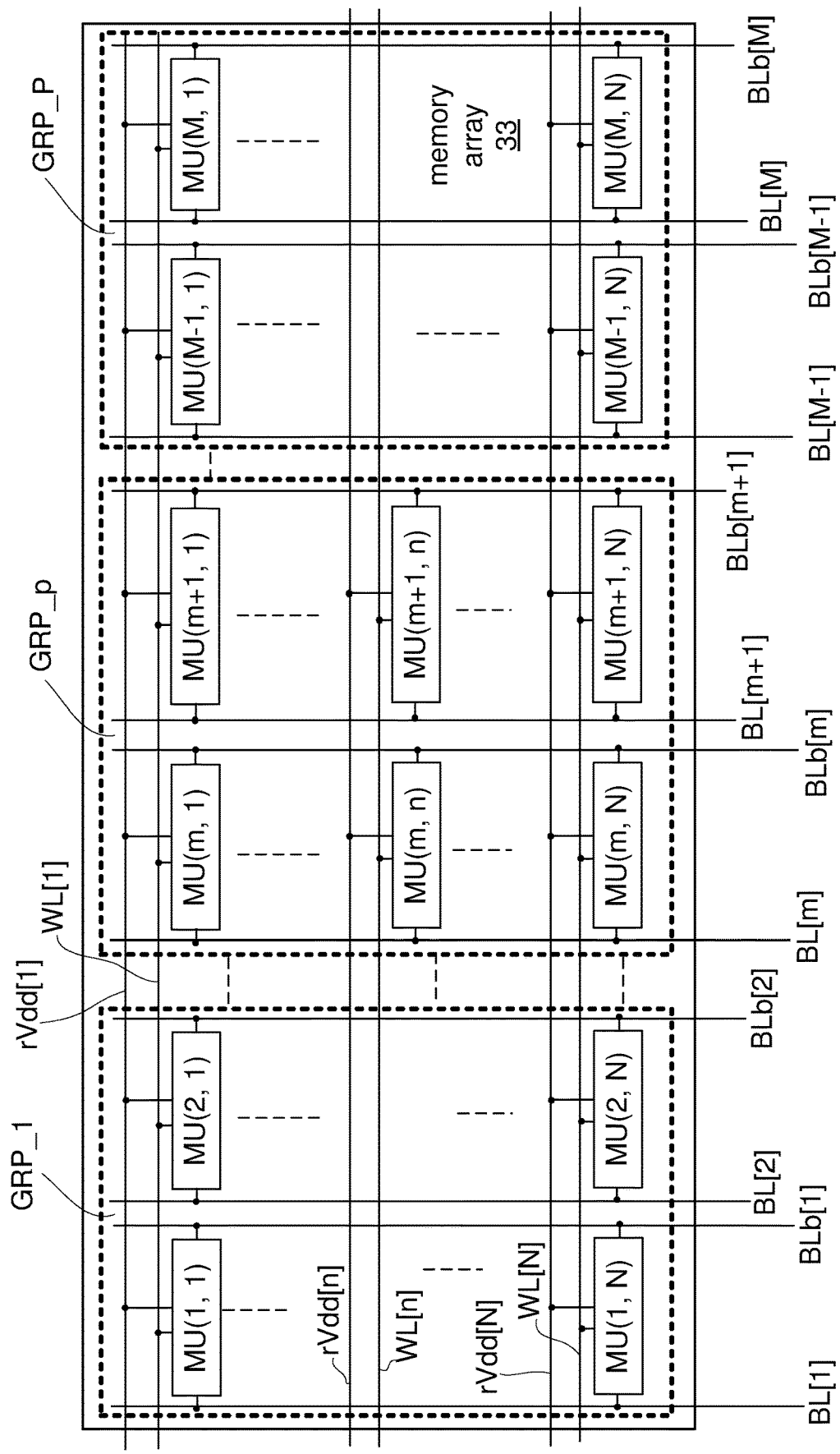
FIG. 10 is a schematic diagram showing that the memory units MU(1, 1)~MU(M, N) are divided into P precharge groups GRP_1~GRP_P according to the column positions (1~M) of the memory units MU(1, 1)~MU(M, N).

Please refer to FIG. 10, which is a schematic diagram showing that the memory units MU(1, 1)~MU(M, N) are divided into P precharge groups GRP_1~GRP_P according to the column positions (1~M) of the memory units MU(1, 1)~MU(M, N). For illustration purposes, it is supposed that the selected memory unit MU(m, n) belongs to the precharge group GRP_p, wherein p is a positive integer and p≤P. Hence, in addition to the bit-line signal BL[m] and the complementary bit-line signal BLb[m] connected to the selected memory unit MU(m, n), the bit-line driving module 37 also precharges the (Q-1) bit-line signals BL and the (Q-1) complementary bit-line signals BLb, which belong to the same precharge group GRP_p as the mth column, to the precharge voltage Vpre before the time point t1. In a concise manner, Q=2 in the example of FIG. 10. It is to be noted that the values of P and Q are not limited in real applications (for example, Q=4 or 8).

The precharge group GRP_1 includes the first column of the memory units MU(1, 1~N) and the second column of the memory units MU(2, 1~N). Before the controller 31 performs a read/write operation on any one of the memory units MU(1, 1~N) and MU(2, 1~N), the bit lines BL[1], BL[2] and the complementary bit lines BLb[1], BLb[2] belonging to the precharge group GRP_1 are precharged to the precharge voltage Vpre during the precharge period Tpre.

The precharge group GRP_p includes the mth column of the memory units MU(m, 1~N) and the (m+1)th column of the memory units MU(m+1, 1~N). Before the controller 31 performs read/write operation on any one of the memory units MU(m, 1~N) and MU(m+1, 1~N), the bit-line signals BL[m], BL[m+1] and the complementary bit-line signals BLb[m], BLb[m+1] belonging to the precharge group GRP_p are precharged to the precharge voltage Vpre during the precharge period Tpre.

The precharge group GRP_P includes the (M-1)th column of the memory units MU(M-1, 1~N) and the Mth column of the memory units MU(M, 1~N). Before the controller 31 performs read/write operation on any one of the memory units MU(M-1, 1~N) and MU(M, 1~N), the bit-line signals BL[M-1], BL[M] and the complementary bit-line signals BLb[M-1], BLb[M] belonging to the precharge group GRP_P are precharged to the precharge voltage Vpre during the precharge period Tpre.

As described above, the selected memory unit MU(m, n) and the unselected memory units MU(1, n)~MU(m-1, n), MU(m+1, n)~MU(M, n) located in the same nth row are electrically connected to the same word line WL[n]. The half-select disturbance probably occurs in the unselected memory units MU(1, n)~MU(m-1, n), MU(m+1, n)~MU(M, n) because the word line WL[n] is enabled. The selected memory unit MU(m, n) receives the word-line signal WL[n], the bit-line signal BL[m], and the complementary bit-line signal BLb[m]. The unselected memory units $MU_{precharge}$, which are located in the same row and the same precharge group as the selected memory unit MU(m, n), receive the word-line signal WL[n], the bit-line signals BL and the complementary bit-line signals BLb. The unselected memory units $MU_{precharge}$ and the selected memory unit MU(m, n) receive the same word-line signal WL[n]; the bit-line signals BL associated with the unselected memory units $MU_{precharge}$ are similar to the bit-line signal BL[m] associated with the selected memory unit MU(m, n); and the complementary bit-line signals BLb associated with the unselected memory units $MU_{precharge}$ are similar to the complementary bit-line signal BLb[m] associated with the selected memory unit MU(m, n). Therefore, the half-select disturbance is worse in these unselected memory units $MU_{precharge}$.

Figure 11:
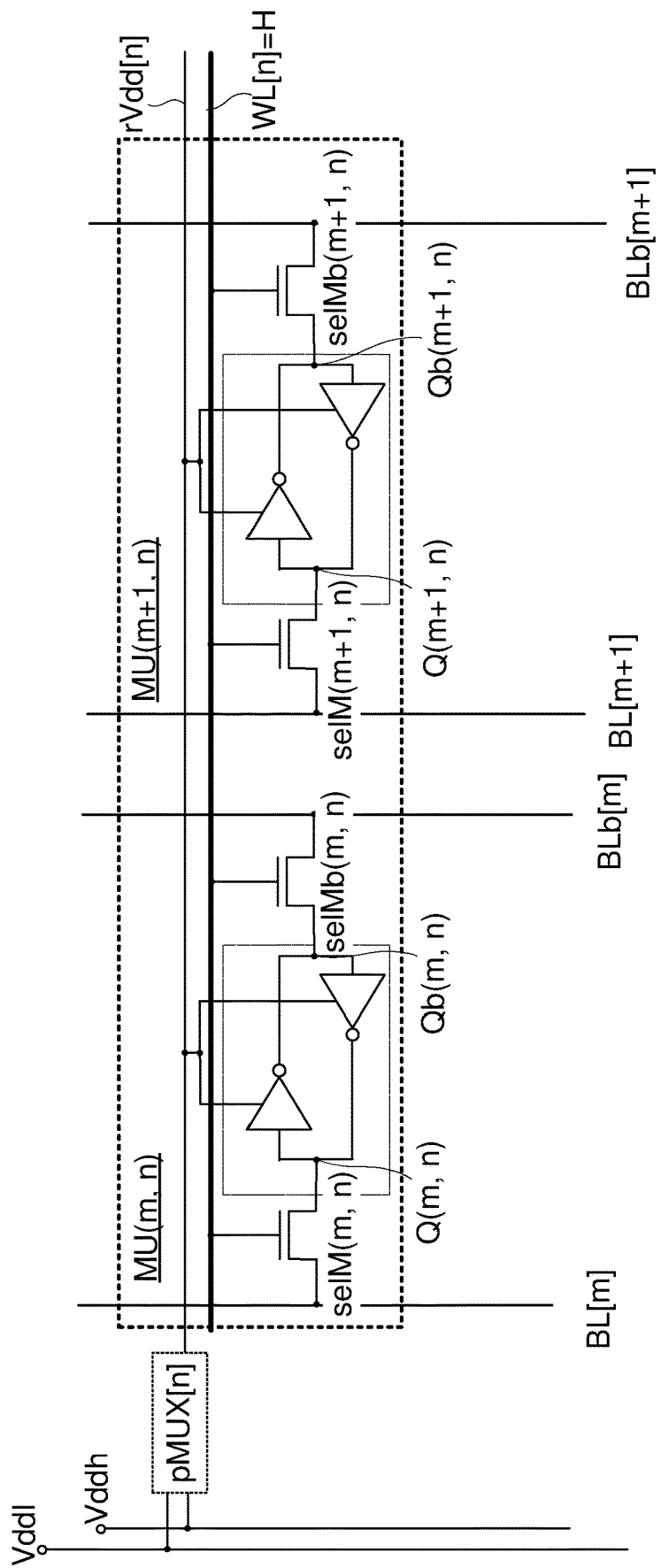
FIG. 11 is a circuit diagram showing two memory units MU(m, n) and MU(m+1, n) arranged in one row of the SRAM circuit according an embodiment of the disclosure.
Figures 12A, 12B:
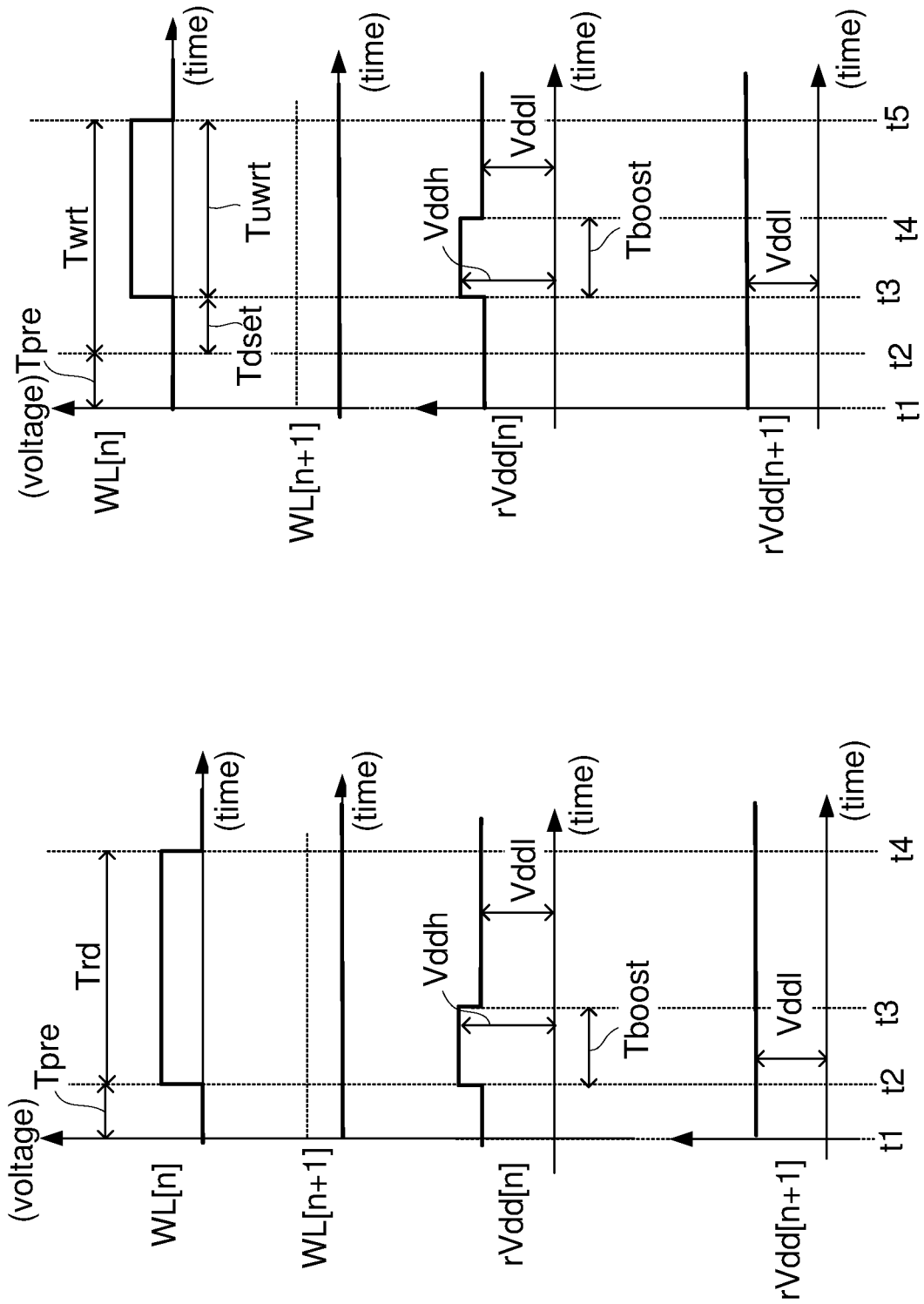
FIG. 12A is a wave graph showing waves of the word-line signals WL[n], WL[n+1] and the row selection voltages rVdd[n], rVdd[n+1] when reading the memory unit MU(m, n).
FIG. 12B is a wave graph showing waves of the word-line signals WL[n], WL[n+1] and the row selection voltages rVdd[n], rVdd[n+1] when writing the memory unit MU(m, n).

The memory units of the disclosure have reduced half-select disturbance, and the reason is given as follows. FIG. 11 shows two memory units MU(m, n) and MU(m+1, n) located in the nth row and belonging to the precharge group GRP_p in FIG. 10. FIGS. 12A and 12B show the waves associated with the nth row and the (n+1)th row of the memory units MU.

Please refer to FIG. 11, which is a circuit diagram showing two memory units MU(m, n) and MU(m+1, n), in one row of the SRAM circuit according to an embodiment of the disclosure. The memory units MU(m, n) and MU(m+1, n) in FIG. 11 have similar interior elements to the memory units MU(m, n) and MU(m+1, n) in FIG. 2. The connection between the memory units MU(m, n), MU(m+1, n), the bit line BL[m], the complementary bit line BLb[m], and the word line WL[n] in FIG. 11 is also similar to that in FIG. 2.

Figure 2:
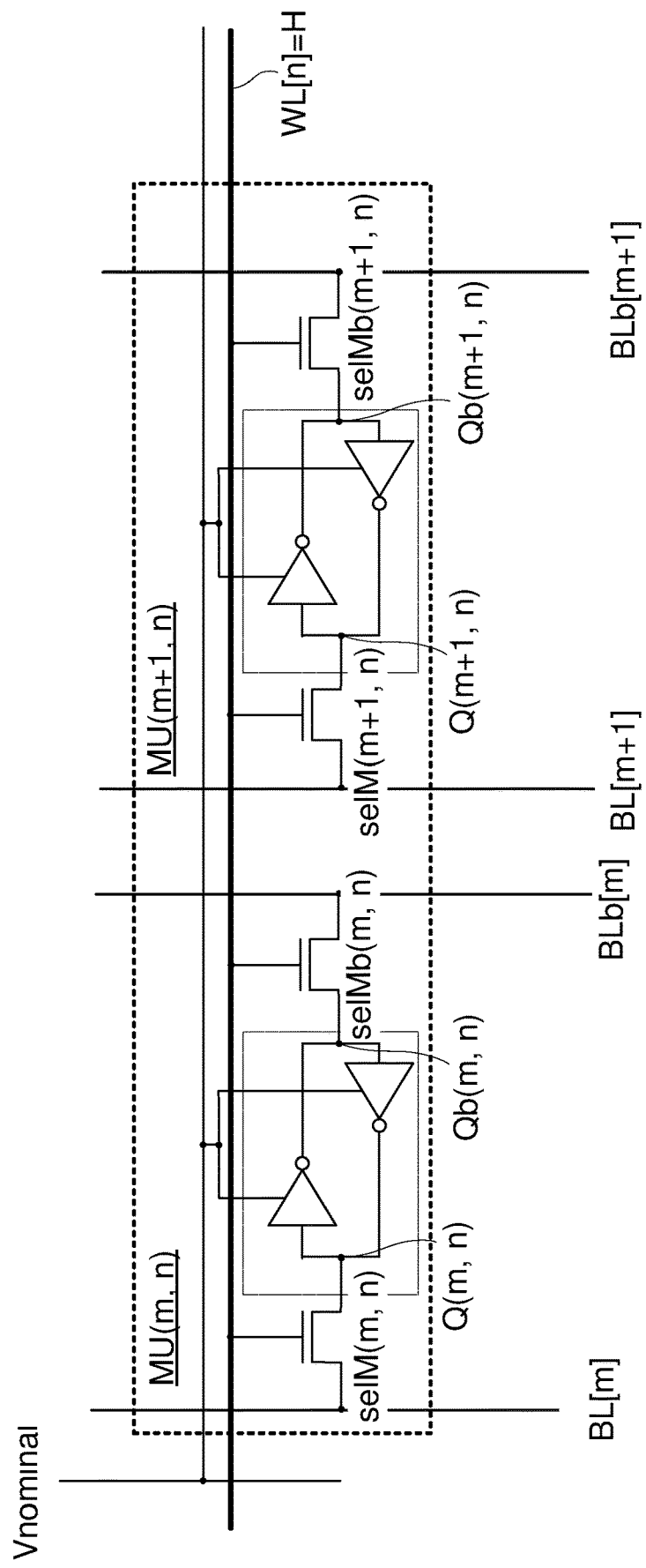
FIG. 2 (Prior Arts) is a schematic diagram illustrating disturbance occurring along a row direction in the conventional SRAM circuit by taking two memory units MU(m, n) and MU(m+1, n), in one row as an example.

Compared to FIG. 2, the difference is that the memory units MU(m, n) and MU(m+1, n) in FIG. 11 are electrically connected to the row-voltage selection line rVdd[n], and the row-voltage selection line rVdd[n] is electrically connected to the voltage selector pMUX[n]. FIGS. 12A and 12B will show that the row-voltage selection lines rVdd[n] and rVdd[n+1] receive the supply voltage Vddl or the supply voltage Vddh from the voltage selector pMUX[n], and different waveforms are presented at the row-voltage selection lines rVdd[n] and rVdd[n+1].

FIGS. 12A and 12B take the word-line signal WL[n+1] and the row selection voltage rVdd[n+1] as an example of the unselected row-direction signals. In real applications, when the controller 31 performs a read operation on the memory unit MU(m, n), the word-line signal WL[n+1] and the row selection voltage rVdd[n+1] in FIG. 12A represent the word-line signals WL and the row selection voltages rVdd associated with all unselected rows. On the other hand, when the controller 31 performs a write operation on the memory unit MU(m, n), the word-line signal WL[n+1] and the row selection voltage rVdd[n+1] in FIG. 12B represent the word-line signals WL and the row selection voltages rVdd associated with all unselected rows.

Please refer to FIG. 12A, which is a wave graph showing waves of the word-line signals WL[n], WL[n+1] and the row selection voltages rVdd[n], rVdd[n+1] when reading the memory unit MU(m, n). In the wave graph of FIG. 12A, time is on the horizontal axis, and voltage is on the vertical axis. The time period between the time points t1 and t2 is the precharge period Tpre corresponding to the precharge group GRP_p. The time period between the time points t2 and t4 is the read period Trd corresponding to the memory unit MU(m, n). The read period Trd includes the boost period Tboost between the time points t2 and t3. In real applications, the boost period Tboost and the read period Trd could be equal in length. In other words, the time points t3 and t4 may coincide.

The waves in FIG. 12A are the word-line signal WL[n], the word-line signal WL[n+1], the row selection voltage rVdd[n] and the row selection voltage rVdd[n+1], respectively, when the controller 31 performs the read operation on the memory unit MU(m, n). These waves are described sequentially as follows.

The word-line signal WL[n] has the logic low level (L) during the precharge period Tpre (between the time points t1 and t2); the word-line signal WL[n] has the logic high level (H) during the read period Trd (between the time points t2 and t4); and the word-line signal WL[n] restores the logic low level (L) when the read period Trd ends (after the time point t4). On the other hand, because the memory unit MU(m, n+1) is not selected, the controller 31 controls the word-line signal WL[n+1] to continuously maintain the logic low level (L) no matter whether the time point under discussion is before, within or after the read period Trd.

The controller 31 uses the voltage selector pMUX[n] to set the row selection voltage rVdd[n] to the supply voltage Vddl during the precharge period Tpre (between the time points t1 and t2); the controller 31 uses the voltage selector pMUX[n] to set the row selection voltage rVdd[n] to the supply voltage Vddh during the boost period Tboost (between the time points t2 and t3); and the controller 31 uses the voltage selector pMUX[n] to set the row selection voltage rVdd[n] to the supply voltage Vddl after the boost period Tboost (after the time point t3). On the other hand, the controller 31 uses the voltage selector pMUX[n+1] to set the row selection voltage rVdd[n+1] to the supply voltage Vddl no matter whether the time point under discussion is before, within, or after the read period Trd.

In the embodiment of the disclosure, the supply voltage Vddl could be the nominal voltage Vnominal (that is, Vddl=Vnominal), and the supply voltage Vddh could be the sum of the nominal voltage Vnominal and the boost voltage Vboost (that is, Vddh=Vnominal+Vboost). Therefore, during the read operation on the memory unit MU(m, n), the controller 31 sets the row selection voltage rVdd[n] as follows: the row selection voltage rVdd[n]=Vnominal (the precharge period)→the row selection voltage rVdd[n]=(Vnominal+Vboost) (the boost period Tboost)→the row selection voltage rVdd[n]=Vnominal (after the boost period Tboost).

Please refer to FIGS. 3, 11, and 12A. The controller 31 uses the bit-line driving module 37 to set the bit-line signals BL[m], BL[m+1] and the complementary bit-line signals BLb[m], BLb[m+1] to the precharge voltage Vpre during the precharge period Tpre. After the read period Trd, the read data rdDAT stored in the memory unit MU(m, n) is transmitted to the sensing module 39 through the bit-line signal BL[m] and the complementary bit-line signal BLb[m]. Afterward, the controller 31 can obtain the content of the read data rdDAT from the sensing module 39.

During the read period Trd, the gate terminals of the selection transistor selM(m+1, n) and the inverted selection transistor selMb(m+1, n) of the memory unit MU(m+1, n) receive the word-line signal WL[n] having the logic high level (H) so that the selection transistor selM(m+1, n) and the inverted selection transistor selMb(m+1, n) are switched on. However, the source terminals of the PMOS transistors of the latch inverters INV1(m+1, n) and INV2(m+1, n) of the memory unit MU(m+1, n) receive the higher supply voltage Vddh during the boost period Tboost. Therefore, the voltages at the data terminal Q(m+1, n) and the inverted data terminal Qb(m+1, n) are stable and resistant to the disturbance from the turned-on selection transistor selM(m+1, n), and the turned-on inverted selection transistor selMb(m+1, n).

Also, the voltage at the data terminal Q(m+1, n) is insensitive to the bit-line signal BL[m+1], and the voltage at the inverted data terminal Qb(m+1, n) is insensitive to the complementary bit-line signal BLb[m+1]. From the description with reference to FIG. 12A, the SRAM circuit of the disclosure can reduce the half-select disturbance in the memory unit MU(m+1, n), which is located in the same precharge group GRP_p and the same nth row as the memory unit MU(m, n), during the read operation even though the word-line signal WL[n] has the logic high level (H).

Please refer to FIG. 12B, which is a wave graph showing waves of the word-line signals WL[n], WL[n+1] and the row selection voltages rVdd[n], rVdd[n+1] when writing the memory unit MU(m, n). In the wave graph of FIG. 12B, time is on the horizontal axis, and voltage is on the vertical axis.

The time period between the time points t1 and t2 is the precharge period Tpre corresponding to the precharge group GRP_p. The time period between the time points t2 and t5 is the write period Twrt corresponding to the memory unit MU(m, n). The write period Twrt includes a data setting period Tdset between the time points t2 and t3, and a unit write period Tuwrt between the time points t3 and t5. The unit write period Tuwrt further includes the boost period Tboost between the time points t3 and t4. In real applications, the boost period Tboost and the unit write period Tuwrt could be equal in length. In other words, the time points t4 and t5 may coincide.

The waves in FIG. 12B are the word-line signal WL[n], the word-line signal WL[n+1], the row selection voltage rVdd[n], and the row selection voltage rVdd[n+1], respectively, when the controller 31 performs the write operation on the memory unit MU(m, n). These waves are described sequentially as follows.

The word-line signal WL[n] has the logic low level (L) during the precharge period Tpre (between the time points t1 and t2) and the data setting period (between the time points t2 and t3); the word-line signal WL[n] has the logic high level (H) during the unit write period Tuwrt (between the time points t3 and t5); and the word-line signal WL[n] restores the logic low level (L) when the unit write period Tuwrt ends (after the time point t5). On the other hand, the controller 31 controls the word-line signal WL[n+1] to continuously maintain the logic low level (L) no matter whether the time point under discussion is before, within, or after the unit write period Tuwrt.

The controller 31 uses the voltage selector pMUX[n] to set the row selection voltage rVdd[n] to the supply voltage Vddl during the precharge period Tpre (between the time points t1 and t2) and the data setting period Tdset (between the time points t2 and t3); the controller 31 uses the voltage selector pMUX[n] to set the row selection voltage rVdd[n] to the supply voltage Vddh during the boost period Tboost (between the time points t3 and t4); and the controller 31 uses the voltage selector pMUX[n] to set the row selection voltage rVdd[n] to the supply voltage Vddl after the boost period Tboost (after the time point t4). On the other hand, the controller 31 uses the voltage selector pMUX[n+1] to set the row selection voltage rVdd[n+1] to the supply voltage Vddl no matter whether the time point under discussion is before, within, or after the unit write period Tuwrt.

In the embodiment of the disclosure, the supply voltage Vddl could be the nominal voltage Vnominal (that is, Vddl=Vnominal), and the supply voltage Vddh could be the sum of the nominal voltage Vnominal and the boost voltage Vboost (that is, Vddh=Vnominal+Vboost). Therefore, during the write operation on the memory unit MU(m, n), the controller 31 sets the row selection voltage rVdd[n] as follows: the row selection voltage rVdd[n]=Vnominal (the precharge period Tpre and the data setting period Tdset) →the row selection voltage rVdd[n]=(Vnominal+Vboost) (the boost period Tboost)→the row selection voltage rVdd[n]=Vnominal (after the boost period Tboost).

Please refer to FIGS. 3, 11, and 12B. The controller 31 uses the bit-line driving module 37 to set the bit-line signals BL[m], BL[m+1] and the complementary bit-line signals BLb[m], BLb[m+1] to the precharge voltage Vpre during the precharge period Tpre. During the data setting period Tdset following the precharge period Tpre, the controller 31 uses the bit-line driving module 37 to set the bit-line signal BL[m] and the complementary bit-line signal BLb[m] according to the write data wrDAT.

For example, if the write data wrDAT is "0b1", the bit-line driving module 37 maintains the voltage of the bit-line signal BL[m] at the precharge voltage Vpre and discharges the complementary bit-line signal BLb[m] to the ground voltage Gnd during the data setting period Tdset. On the other hand, if the write data wrDAT is "0b0", the bit-line driving module 37 discharges the bit-line signal BL[m] to the ground voltage Gnd and maintains the voltage of the complementary bit-line signal BLb[m] at the precharge voltage Vpre during the data setting period Tdset. Furthermore, the other bit lines BL and complementary bit lines BLb, which are not connected to the selected memory unit MU(m, n) but belong to the precharge group GRP_p including the selected memory unit MU(m, n), are in a floating state.

If the write data wrDAT is "0b1", the bit-line driving module 37 maintains the voltage of the bit-line signal BL[m] at the precharge voltage Vpre, and discharges the complementary bit-line signal BLb[m] to the ground voltage Gnd during the data setting period Tdset. Afterward, the data terminal Q(m, n) of the memory unit MU(m, n) receives the precharge voltage Vpre from the bit line BL[m] because the selection transistor selM(m, n) is switched on during the unit write period Tuwrt. It is viewed as that the bit-line driving module 37 uses the bit-line signal BL[m] to set the voltage at the data terminal Q(m, n). Similarly, the inverted data terminal Qb(m, n) of the memory unit MU(m, n) receives the ground voltage Gnd from the complementary bit line BL[m] because the inverted selection transistor selMb(m, n) is switched on. It is viewed that the bit-line driving module 37 uses the complementary bit-line signal BLb[m] to set the voltage at the inverted data terminal Qb(m, n). Therefore, the write data wrDAT="0b1" is latched in the memory unit MU(m, n) with the logic high level (H) at the data terminal Q(m, n) and the logic low level (L) at the inverted data terminal Qb(m, n), and the write operation is finished.

During the unit write period Tuwrt, the gate terminals of the selection transistor selM(m+1, n) and the inverted selection transistor selMb(m+1, n) of the memory unit MU(m+1, n) receive the word-line signal WL[n] having the logic high level (H) so that the selection transistor selM(m+1, n) and the inverted selection transistor selMb(m+1, n) are switched on. However, the source terminals of the PMOS transistors of the latch inverters INV1(m+1, n) and INV2(m+1, n) of the memory unit MU(m+1, n) receive the higher supply voltage Vddh during the boost period Tboost. Therefore, the voltages at the data terminal Q(m+1, n) and the inverted data terminal Qb(m+1, n) are stable and resistant to the disturbance from the turned-on selection transistor selM(m+1, n), and the inverted selection transistor selMb(m+1, n).

Hence, in the SRAM circuit of the disclosure, the voltage at the data terminal Q(m+1, n) of the memory unit MU(m+1, n), which is located in the same row as the selected memory unit MU(m, n), is insensitive to the bit-line signal BL[m+1]; and the voltage at the inverted data terminal Qb(m+1, n) is insensitive to the complementary bit-line signal BLb[m+1]. From the description with reference to FIG. 12B, the SRAM circuit of the disclosure can reduce the half-select disturbance in the memory unit MU(m+1, n), which is located in the same precharge group GRP_p and the same nth row as the memory unit MU(m, n), during the write operation even though the word-line signal WL[n] has the logic high level (H).

As described in the above embodiments, the present disclosure alternatively provides the supply voltage Vddh and the supply voltage Vddl to the row-voltage selection line rVdd[n] connected to the selected memory unit MU(m, n), and a switching mechanism of the row selection voltage rVdd[n] is also provided. Through proper modification, the embodiments could be applied to read/write operation on the memory units MU arranged in more columns and rows.

As described above, the concept of the disclosure is setting the row selection voltage rVdd[n] to the supply voltage Vddh during the boost period Tboost, and changing the row selection voltage rVdd[n] from the supply voltage Vddh to the supply voltage Vddl after the boost period Tboost. By switching the row selection voltage rVdd[n] among the supply voltages Vddh and Vddl, it can reduce the leakage disturbance to the data stored in the memory unit MU(m, n). When the data stored in the memory unit MU(m, n) is different from the data stored in the memory units MU(m, 1~(n~1)), MU(m, (n+1)~N) located in the same mth column as the memory unit MU(m, n), the voltages at the data terminals are insensitive to the current leakage flowing through the bit-line signal BL[m] and the complementary bit-line signal BLb[m]. Furthermore, the disclosure can reduce the half-select disturbance in the memory units MU(Q*(p−1)+1, n)~MU(Q*p, n) when the precharge groups GRP_1~GRP_P are used to control the voltages of the bit-line signals BL and the complementary bit-line signals BLb. The data stored in the memory units MU(Q*(p−1)+1, n)~MU(Q*p, n), which are located in the same precharge group GRP_p and the same nth row as the selected memory unit MU(m, n), are well latched to prevent from being altered.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A static random access memory circuit comprising:
a plurality of memory units arranged in M columns and N rows;
M bit lines, each of which is electrically connected to N memory units located in a corresponding one of the M columns;
N row-voltage selection lines, each of which is electrically connected to M memory units located in a corresponding one of the N rows;
N word lines, each of which is electrically connected to the M memory units located in the corresponding one row; and
a control circuit, comprising:
a controller;
a voltage source providing a first voltage and a second voltage;
a voltage selection module electrically connected to the controller, the voltage source, and the N row-voltage selection lines, wherein the voltage selection module selectively transmits one of the first voltage and the second voltage to at least an nth row-voltage selection line of the N row-voltage selection lines, and transmits the second voltage to the row-voltage selection lines except the at least the nth row-voltage selection line;
a word-line driving module electrically connected to the controller and the N word lines; and
a bit-line driving module electrically connected to the controller and the M bit lines, wherein M, N, and n are positive integers, and n is smaller than or equal to N, wherein during an access period,
the voltage selection module transmits the first voltage to the at least the nth row-voltage selection line during a boost period, and
the voltage selection module transmits the second voltage to the at least the nth row-voltage selection line before and after the boost period,
wherein the boost period is shorter than the access period, and a read operation or a write operation is performed during the access period.

2. The static random access memory circuit according to claim 1, wherein
a selected memory unit located in an mth column and an nth row comprises:
a first latch inverter electrically connected to the nth row-voltage selection line;
a second latch inverter electrically connected to the nth row-voltage selection line; and
a first selection transistor electrically connected to an mth bit line of the M bit lines, an nth word line of the N word lines, the first latch inverter, and the second latch inverter, wherein m is a positive integer and m is smaller than or equal to M.

3. The static random access memory circuit according to claim 2, wherein the selected memory unit further comprises a second selection transistor electrically connected to the nth word line, the first latch inverter, and the second latch inverter.

4. The static random access memory circuit according to claim 3, further comprising M complementary bit lines corresponding to the M bit lines, wherein an mth complementary bit line of the M complementary bit lines is electrically connected to the second selection transistor.

5. The static random access memory circuit according to claim 1, wherein the voltage source comprises a boost voltage generator electrically connected to the voltage selection module, for generating the first voltage based on the second voltage, wherein the first voltage is higher than the second voltage.

6. The static random access memory circuit according to claim 1, wherein the voltage selection module receives a boost enable signal from the controller, and selectively provides one of the first voltage and the second voltage to the at least the nth row-voltage selection line in response to the boost enable signal.

7. A read operation method of a static random access memory circuit, wherein the static random access memory circuit comprises a control circuit and a plurality of memory units arranged in M columns and N rows, each of the N rows comprising M memory units electrically connected to a corresponding one of N row-voltage selection lines and a corresponding one of N word lines, each of the M columns comprising N memory units electrically connected to a corresponding one of M bit lines, the read operation method comprising steps of:
the control circuit receiving a memory address from a host circuit, wherein the memory address is associated with a selected memory unit located in an mth column and an nth row;
the control circuit enabling an nth word line of the N word lines and enabling a sense amplifier connected to an mth bit line of the M bit lines during a read period;
the control circuit connecting an nth row-voltage selection line of the N row-voltage selection lines to a first voltage during a boost period;
the control circuit connecting the nth row-voltage selection line to a second voltage after the boost period, wherein the first voltage is higher than the second voltage, and the boost period is shorter than the read period; and the sense amplifier converting a bit-line signal transmitted from the mth bit line into read data to be transmitted to the host circuit, wherein M, N, m, and n are positive integers, m is smaller than or equal to M, and n is smaller than or equal to N.

8. The read operation method according to claim 7, further comprising a step of:

the control circuit disabling the nth word line and the sense amplifier after the read period.

9. The read operation method according to claim 7, further comprising a step of:

the control circuit connecting the mth bit line to a third voltage before the read period, wherein the second voltage is higher than or equal to the third voltage.

10. The read operation method according to claim 7, wherein:

a ratio of the first voltage to the second voltage is 1.5; or the ratio of the first voltage to the second voltage ranges from 1.1 to 1.5.

11. The read operation method according to claim 7, further comprising a step of:

the control circuit connecting the nth row-voltage selection line to the second voltage before the boost period.

12. A write operation method of a static random access memory circuit, wherein the static random access memory circuit comprises a control circuit and a plurality of memory units arranged in M columns and N rows, each of the N rows comprising M memory units electrically connected to a corresponding one of N row-voltage selection lines and a corresponding one of N word lines, each of the M columns comprising N memory units electrically connected to a corresponding one of M bit lines, the write operation method comprising steps of:

the control circuit receiving write data and a memory address from a host circuit, wherein the memory address is associated with a selected memory unit located in an mth column and an nth row;

the control circuit setting a write voltage of an mth bit line of the M bit lines according to the write data during a data setting period;

the control circuit enabling an nth word line of the N word lines and storing the write data in the selected memory unit according to the write voltage of the mth bit line during a unit write period, wherein the unit write period follows the data setting period;

the control circuit connecting an nth row-voltage selection line of the N row-voltage selection lines to a first voltage during a boost period, wherein the boost period is included in the unit write period; and the control circuit connecting the nth row-voltage selection line to a second voltage after the boost period, wherein M, N, m, and n are positive integers, m is smaller than or equal to M, and n is smaller than or equal to N.

13. The write operation method according to claim 12, further comprising steps of:

the control circuit connecting the nth row-voltage selection line to the second voltage before and after the unit write period; and the control circuit connecting a first to an (n~1)th row-voltage selection lines and an (n+1)th to an Nth row-voltage selection lines of the N row-voltage selection lines to the second voltage during the unit write period.

14. The write operation method according to claim 12, further comprising steps of:

the control circuit disabling the N word lines before and after the unit write period; and the control circuit disabling a first to an (n~1)th word lines and an (n+1)th to an Nth word lines of the N word lines during the unit write period.

15. The write operation method according to claim 12, wherein the first voltage is higher than the second voltage.

16. The write operation method according to claim 15, wherein a ratio of the first voltage to the second voltage ranges from 1.1 to 1.5.

17. The write operation method according to claim 12, further comprising a step of:

the control circuit connecting the mth bit line to a third voltage during a precharge period, wherein the data setting period follows the precharge period, the third voltage is lower than the first voltage, and the second voltage is higher than or equal to the third voltage.

* * * * *